United States Patent [19]

Moslehi

[11] Patent Number: 5,079,481
[45] Date of Patent: Jan. 7, 1992

[54] PLASMA-ASSISTED PROCESSING MAGNETON WITH MAGNETIC FIELD ADJUSTMENT

[75] Inventor: Mehrdad M. Moslehi, Dallas, Tex.
[73] Assignee: Texas Instruments Incorporated, Dallas, Tex.
[21] Appl. No.: 561,741
[22] Filed: Aug. 2, 1990
[51] Int. Cl.$^5$ .............................................. H05H 1/46
[52] U.S. Cl. ........................ 315/111.41; 315/111.21; 313/231.31
[58] Field of Search .................. 315/111.21, 111.41, 315/111.81; 313/231.31; 250/492.2

[56] References Cited

U.S. PATENT DOCUMENTS

| | | | |
|---|---|---|---|
| 3,445,722 | 5/1969 | Scott et al. | 315/111.41 |
| 4,838,978 | 6/1989 | Sekine et al. | 118/623 X |
| 4,909,314 | 3/1990 | Lamont, Jr. | 204/192.12 X |

Primary Examiner—Eugene R. Laroche
Assistant Examiner—Do Hyun Yoo
Attorney, Agent, or Firm—James C. Kesterson; Rene' E. Grossman; Richard L. Donaldson

[57] ABSTRACT

A magnetron plasma processing module (20) with magnetic field adjustment for magnetron-plasma-enhanced processing of a semiconductor wafer includes a magnetron housing, a plurality of magnets (44), and magnetically conductive pins (26) for varying the magnetic field distribution and strength at the semiconductor wafer (52). Top plate (34) adjustably engages magnetically conductive pins (26). A magnetically nonconductive cylinder (36) supports top plate (34) and receives pins (26) from top plate (34). Magnet assembly (40) connects to cylinder (36) and contains magnets (44). Magnet assembly (40) also has bore (82) to receive pins (26). Magnetically conductive ring (38) separates cylinder (36) from magnet assembly (40) and engages pins (26) to isolate the magnetic field from cylinder (36). Magnets (44) and extension iron bars associate with magnet assembly (40) to establish the magnetic field having adjustable uniformity. Iron bars (42) associate with magnets (44) to aid in producing a uniform magnetic field at semiconductor (52). The magnetron module (20) can be rotated to achieve uniform magnetron plasma processing.

27 Claims, 21 Drawing Sheets

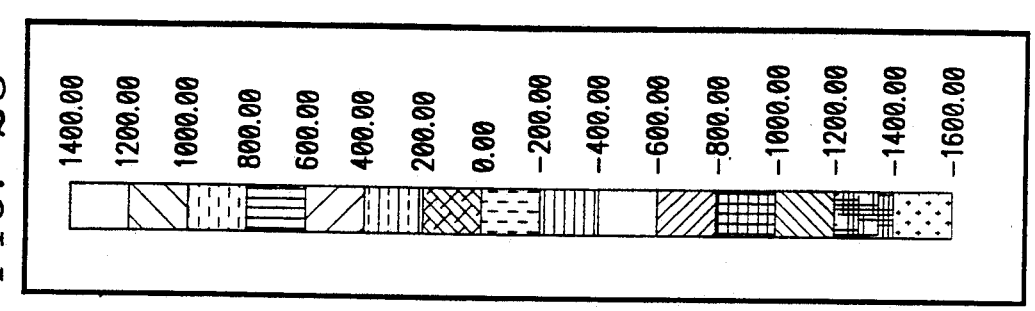
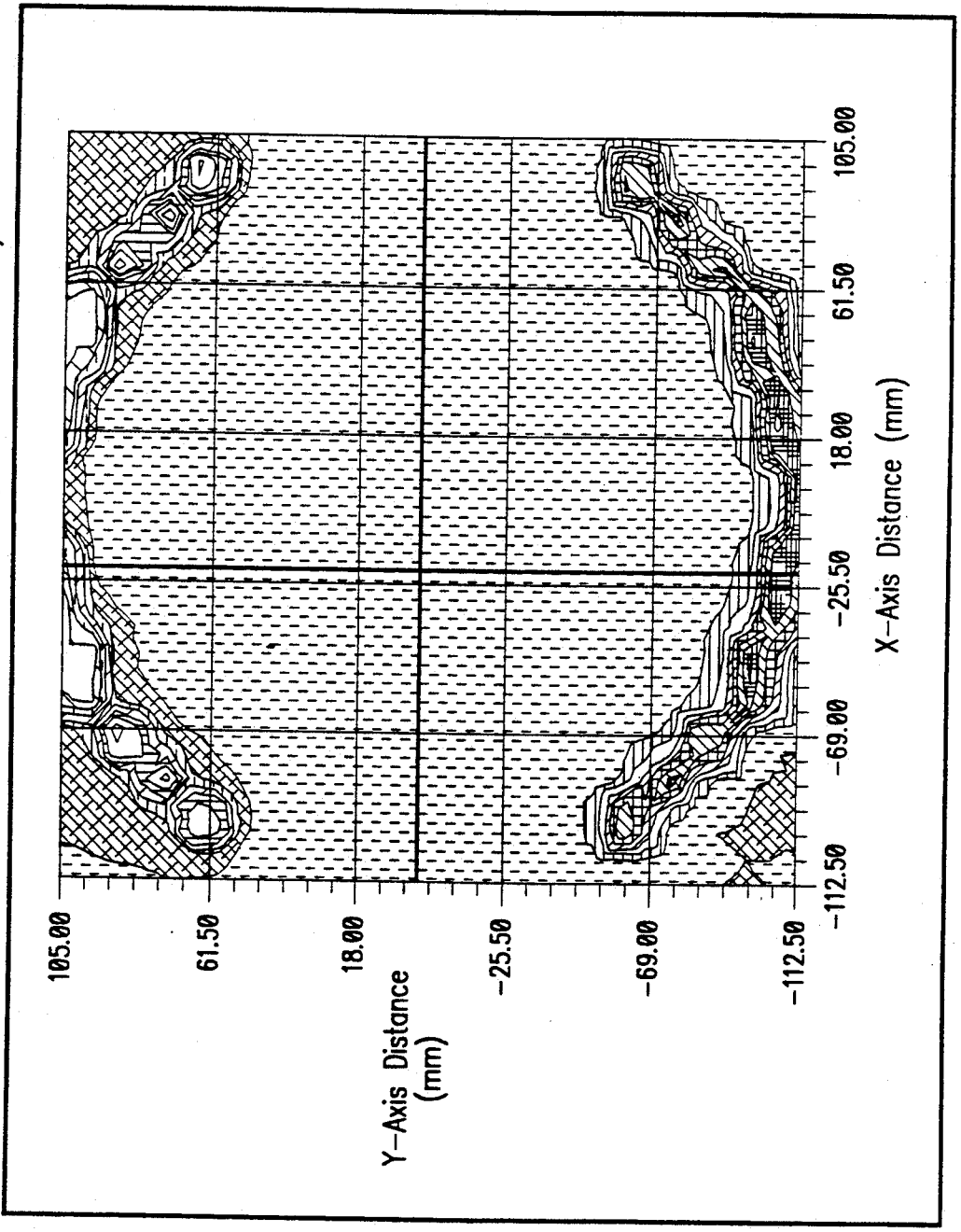
FIG. 23

PLASMA-ASSISTED PROCESSING MAGNETON WITH MAGNETIC FIELD ADJUSTMENT

TECHNICAL FIELD OF THE INVENTION

The present invention relates in general to a magnetron plasma processing module with magnetic field strength and uniformity adjustment, and more particularly to a method and apparatus for adjustable magnetron-plasma-enhanced processing for depositing or etching layers of materials on semiconductor wafers.

BACKGROUND OF THE INVENTION

Manufacturers of electronic components use a variety of processing techniques to fabricate semiconductor devices. One technique that has many applications is known as "plasma-assisted" processing. In plasma-assisted processing, a substantially ionized gas, usually produced by radio-frequency (RF) or microwave electromagnetic gas discharge, generates a mixture of ions, electrons, and excited neutral species, which can react to deposit or etch various material layers on semiconductor substrates in a semiconductor processing reactor. Reactive ion etching (RIE), is an example of a widely used plasma-assisted semiconductor device fabrication process. RIE uses the directional energetic ions in the plasma to anisotropically etch materials on a semiconductor substrate. Various etching applications for plasma-assisted processing in semiconductor device manufacturing include isotropic and anisotropic etching of polysilicon, aluminum, and dielectric layers. Additional applications of plasma processing include plasma-enhanced chemical-vapor deposition (PECVD) of dielectrics, aluminum, copper, amorphous and polycrystalline silicon and other materials. Plasma-enhanced metal-organic chemical-vapor deposition processes (PEMOCVD) have been used for high-rate deposition of aluminum and copper films for semiconductor chip device interconnection applications. Plasma-assisted deposition techniques have also been used for planarized interlevel dielectric formation, including procedures such as bias sputtering; and low-temperature epitaxial silicon growth, including low-energy bias sputtering and PECVD of epitaxial layers.

In RIE, radio-frequency (RF:13.56 MHZ frequency, for example) electromagnetic waves interact with the gas molecules at low pressures (P <mTorr) and produce a plasma medium via gas discharge between two parallel flat or concentric metallic electrodes. In conventional plasma processing techniques such as RIE, there is a trade-off between processing rate and the semiconductor device quality. First of all, increasing the RIE processing rate or throughput requires greater plasma density and/or ion flux (current density) at semiconductor substrate surface. According to the conventional methods, a direct method to increase ion current density is to increase the RF electromagnetic power that produces the plasma between two plasma electrodes. In RIE, the semiconductor wafer is usually clamped against one of the electrodes. Increasing the RF power transmitted to the plasma medium, however, raises the peak energies of plasma ions incident on the semiconductor substrate. Energetic ions (e.g. as high as 100's of eV) produced in plasma processing media can reduce device manufacturing yield due to irradiation damage and incorporation of metallic and other contaminants into the semiconductor device surface (contaminants sputter etched from plasma electrodes and reactor walls). When this type of plasma-induced surface damage occurs, post-plasma surface cleaning and/or annealing processes are necessary to reconstruct the surface and minimize the adverse effects to semiconductor device performance and manufacturing yield. The known RIE processes, based on fluorocarbon chemistries can also leave nonvolatile deposits such as fluorohydrocarbons on the semiconductor substrate surface. Ultimately, the manufacturer must remove these undesirable surface deposits and contaminants from the semiconductor device.

The combined effects of irradiation damage and incorporation of various types of surface contaminants produce semiconductor devices with less than optimal performance characteristics and limit fabrication process yield. Thus, with conventional RF plasma-assisted processing techniques, increasing RF power to increase ion current density with the intent to raise the processing throughput can have serious detrimental side effects. The interactions of the energetic charged species within a plasma processing module with the plasma electrode chamber walls can be a major source of metallic contamination in plasma-processed wafers. If a method existed, however, to increase the ion flux density on the semiconductor substrate without also substantially increasing ion energies, then a manufacturer may increase plasma-assisted processing rates with negligible surface damage or substrate contamination problems.

Therefore, a need exists for a method and apparatus to increase ion density and flux near a semiconductor substrate during plasma-assisted processing without at the same time significantly increasing ion energy levels.

Another limitation of conventional plasma-assisted processes derives from the fact that, during these processes, plasma disperses throughout the fabrication process chamber. In so doing, it interacts with the fabrication reactor chamber walls. These walls contain various metals (e.g. Fe, Al, Ni, etc.) that the ions can remove via sputtering (physical etch) and/or chemical reactions, transport to the semiconductor device surface, and embed into the semiconductor substrate. As a result, further semiconductor device degradation occurs. Consequently, there is a need for a method and apparatus to prevent plasma interaction with fabrication reactor process chamber walls during plasma-assisted processing.

To remedy the above problems in plasma-assisted processing, manufacturers often use techniques known as "magnetron-plasma-enhanced" (MPE) processing. MPE processing basically entails applying a predetermined magnetic field in the proximity of the semiconductor wafer during the plasma-assisted process. During an MPE process, a suitable magnetic field interacts with the plasma and causes the plasma to appear as a confined bright gaseous ball enveloping the semiconductor substrate and centered thereat. As a result, the plasma ion density is greatest near the semiconductor wafer, and the plasma that the semiconductor substrate sees does not significantly interact with the process chamber walls. This technique provides improved gas excitation and higher plasma density than with conventional plasma-assisted processes. MPE processing raises the device processing rate and reduces semiconductor device degradation due to energetic ions and process chamber wall contaminants by increasing the ion flux, reducing the average ion energies, and making the plasma concentrate near the semiconductor device. Thus, MPE processing can produce higher semiconductor device processing rates without a substantial increase in plasma ion energies.

Conventional MPE apparatus designs employ two straight permanent magnet bars positioned near the semiconductor device in the fabrication reactor. These permanent magnets produce a magnetic field over the semiconductor device surface which has both transverse and longitudinal magnetic flux components. The relative magnitudes of these magnetic field components vary significantly over the wafer surface. These global magnetic field non-uniformities cause plasma density and ion flux non-uniformities over surface of the semiconductor wafer. Consequently, a semiconductor device layer deposition or etching resulting from these conventional MPE processes will also suffer from undesirable non-uniformities.

The transverse and axial (or longitudinal) flux components from conventional magnetrons in a typical MPE cylindrical processing chamber can be thought of as producing both radial and tangential magnetic field non-uniformities. By rotating the conventional MPE magnetron in the horizontal plane, a conventional MPE magnetron can produce a cylindrically symmetrical magnetic field when averaged over time; however, the rotation cannot by itself eliminate the radial field non-uniformity problems. Rotating conventional MPE magnetrons in this manner requires a more complex fabrication reactor, because the magnetron platform is usually placed within the processing reactor and it must be mechanically driven by some rotating motor or other apparatus. This mechanical apparatus must be monitored and maintained during plasma-assisted processing to ensure that the conventional MPE processing module produces a cylindrically uniform transverse magnetic field distribution (when averaged over time).

Even with rotation, the conventional MPE reactors do not usually provide excellent radial uniformities for the magnetic flux density and the etching or deposition processes. Using the conventional MPE systems, the processing uniformity can only be improved or optimized by adjusting other process parameters such as the plasma RF power and/or process pressure. However, these process parameters, and their variations also affect the processing rate and other important characteristics of the MPE etch and deposition processes (e.g. line width control and etch selectivity in anisotropic etch applications). As a result, there is a need for a method and apparatus that can provide MPE processing with adjustable magnetic field strength and distribution over the semiconductor substrate surface.

While conventional MPE magnetrons may be able to produce a cylindrically symmetrical magnetic field because of the magnetic flux field shape they produce (and because of magnetic rotation), they cannot usually produce a radially uniform magnetic field. To overcome the limitations of a radially non-uniform magnetic flux field and/or nonuniform processing in conventional MPE magnetrons, one approach is to adjust the RF field strength from the RF power source. This adjustment, however, can adversely affect other process parameters associated with RF power. This is because, as already stated, varying the RF power affects the plasma ion energy levels. Variation of ion energy levels can affect selectivity and irradiation damage in etch processes and film stress and quality in deposition processes. As a result, there is a need for a magnetron plasma processing module which is capable of producing a suitable magnetic field distribution for both cylindrical and radial process uniformity in MPE processing of semiconductor devices.

Yet another limitation of conventional MPE processing magnetrons is their inability to make magnetic field distribution uniformity adjustments. The bar magnets of conventional MPE processing magnetrons produce a stationary magnetic field and do not permit flexible uniformity adjustment at different points on wafer surface without adversely affecting the magnetic flux density and distribution at other points near the semiconductor substrate. As a result, there is no capability to control the MPE process uniformity by varying and optimizing the magnetic flux field at various points near the semiconductor wafer. A need exists, therefore, for a method and apparatus that permits adjusting and optimizing the magnetic field distribution near the semiconductor wafer surface and thereby allows adjusting and optimizing MPE process uniformity.

SUMMARY OF THE INVENTION

According to one aspect of the present invention, there is provided a plasma-assisted processing magnetron module with magnetic field distribution and strength adjustments for MPE processing of semiconductor wafers. The magnetron module comprises a magnetron housing. A plurality of permanent magnets and soft magnetic material elements connect to the housing and associate for producing a nearly uniform transverse magnetic field at the semiconductor wafer, and a plurality of magnetically conductive (iron) pins adjustably mount to the housing and associate for varying or optimizing the magnetic field at the semiconductor substrate. Each iron pin can support an iron square block at its end tip (to enhance the magnetic conductance of the pin tips).

Another aspect of the present invention includes a plasma-assisted processing magnetron module with magnetic field adjustment for MPE processing of semiconductor wafers. The magnetron comprises a magnetron housing, a plurality of magnets, a plurality of soft magnetic material (iron) extension bars, and a plurality of magnetically conductive soft iron pins provide and vary a magnetic field at the semiconductor wafer. A top plate in the housing holds the adjustable magnetically conductive iron pins. A magnetically nonconductive, nonmagnetic hollow cylinder supports the top pin array plate and allows the iron pins to extend toward the plane of permanent magnet poles. An alternative arrangement places the top pin array plate and iron pins directly over the permanent magnet assembly without using the buffer hollow cylinder. A shroud, which is part of the housing, connects to the cylinder and contains the permanent magnet and iron bars that produce and shape the magnetic field. A magnetically conductive ring, also part of the housing, separates the top cylinder from the permanent magnet and iron parts and provides a short-circuit path for closing the magnetic flux lines on one side of the magnet poles. The permanent magnet components and iron extension bars are properly arranged and sized in order to provide an adjustable and uniform transverse magnetic field on the semiconductor wafer surface.

Yet another aspect of the present invention is its use with a novel low thermal mass multipurpose radio-frequency chuck which this disclosure describes. The new chuck is disclosed and described in U.S. patent application Ser. No. 07/565,765, entitled "MULTIPURPOSE LOW THERMAL MASS CHUCK FOR SEMICONDUCTOR PROCESSING EQUIPMENT," by the present inventors and filed concurrently with this disclosure. The disclosure and claims of that U.S. patent application are expressly incorporated herein by reference. The multipurpose radio-frequency chuck comprises a coolant module for extracting heat from the semiconductor wafer, a resistive heating element adjoining the coolant module (separated by a thermally conducting and electrically insulting boron niride plate) for heating the semiconductor wafer, and a radio frequency plate for associating an electromagnetic radio frequency power source with the semiconductor wafer (for plasma generation).

A technical advantage of the invention is that it overcomes certain major limitations of known plasma-assisted processing apparatuses and methods. The magnetron plasma processing module of the present invention provides a greater plasma density and ion flux in the proximity of the semiconductor wafer within the processing reactor while at the same time preventing excessive ion energies. Additionally, the present invention provides adjustment capability for uniformity of the transverse magnetic field, thereby assuring uniform plasma ion flux near the semiconductor wafer. MPE processing using the present invention offers a high-throughput and damage-free deposition and etching processes with negligible plasma and reactor-induced process contamination.

Yet another technical advantage of the present invention is that it fully avoids localized and large-scale (global) semiconductor wafer process nonuniformities as processing reactors and semiconductor wafers increase in size. This is due to the fact that the magnetron-plasma processing module of this invention is easily scalable for use with larger wafers and reactors (e.g. 6, 8, and 10-inch wafers).

Another technical advantage of the present invention is that it provides capability for real-time adjustments of the magnetic field distribution uniformity at the semiconductor wafer and, thereby, provides for MPE process uniformity adjustments and optimizations. The two dimensional array of magnetically conductive pins permits adjusting the magnetic field distribution and flux density near the semiconductor wafer surface in the MPE processing chamber. This provides the powerful capability for optimally forming the magnetic flux density and field characteristics over the entire semiconductor device surface during the MPE processing. The MPE processing module of this invention also allows rotation of the permanent magnet assembly for achieving the best process uniformity.

The present invention has a wide variety of applications. Plasma-assisted processes that the present invention can improve include high-rate anisotropic etching (magnetron ion etching or MIE) of polysilicon, aluminum, oxide, nitride, and polyamide layers; plasma-enhanced chemical vapor deposition (PECVD) of dielectrics, aluminum, copper, and other materials; low-temperature dielectric chemical vapor deposition for materials such as boron nitride and oxide; planarized interlevel dielectric formation, including procedures such as MPE-CVD of planarized dielectrics and bias sputtering; and low-temperature epitaxial semiconductor growth, including low-energy bias sputtering. The present invention has been successfully applied to dry development of exposed silylated photoresist layers in oxygen magnetron plasma for 0.4 $\mu$m features (with high rate, good selectivity, and negligible undercut). Other applications will become apparent as manufacturers use the present invention. Besides the MPE etch and CVD applications, the MPE processing module of this invention is also applicable to sputtering cathodes of the physical-vapor deposition systems.

BRIEF DESCRIPTION OF THE DRAWINGS

The invention, as well as modes of use and further advantage, is best understood by reference to the following description of illustrative embodiments when read in conjunction with the accompanying drawings.

FIG. 23 provides a contour diagram of the measured magnetic flux density distribution using a preferred embodiment of the present invention (axial or "z" component of the magnetic field at a plane which is 1-2 mm away from the plane of magnet poles).

DETAILED DESCRIPTION OF THE INVENTION

The preferred embodiment of the present invention is best understood by referring to FIGURES, like numerals being used for like and corresponding parts of the various drawings.

Figure 1:
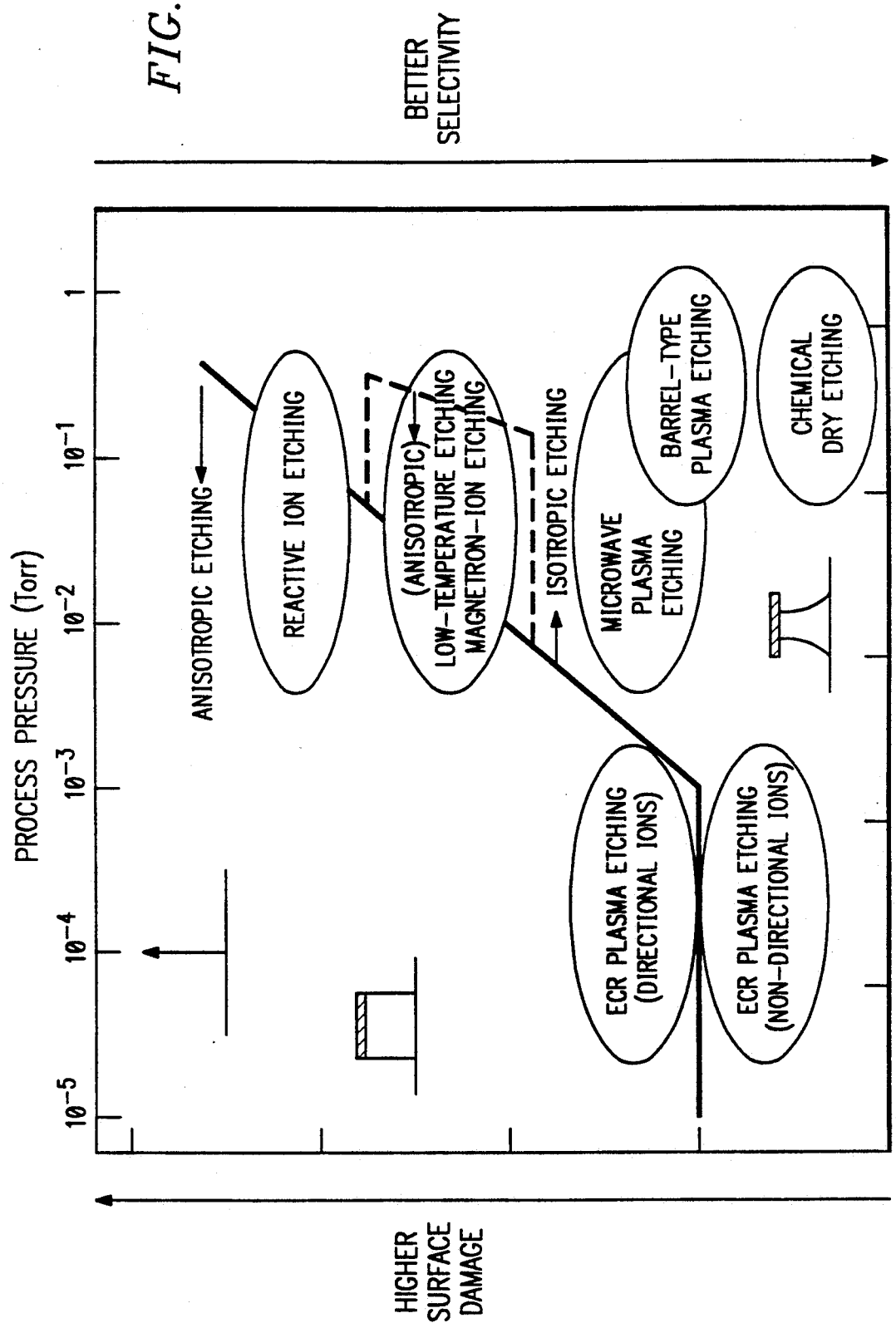
FIG. 1 shows a qualitative plot of plasma-induced surface damage and etch selectivity vs. process pressure for various types of plasma etching techniques including magnetron-ion etching (MIE)

FIG. 1 shows the process parameter domain of magnetron-plasma-enhanced etching (or magnetron-ion etching) and several other plasma-assisted etching techniques. On the vertical axes, higher ion energies correspond to higher plasma-induced surface damage and lower etch selectivity values. The horizontal axis shows the etch process pressure range. The graph also indicates the boundary between the isotropic and anisotropic etching domains. Due to a larger mean-free path and reduced scattering for the activated ions, lower etching process pressures favor anisotropic etching in ion-assisted etch processes. The conventional reactive-ion etching (RIE) techniques usually result in the highest average ion energies (several hundred electron volts) among various etch techniques, RIE techniques can result in rather poor selectivities and some irradiation damage due to the physical etch or sputtering effects of the energetic ions. On the other hand, the magnetron-ion etching (MIE) techniques result in more efficient plasma generation and lower energy ions compared to RIE. MIE is a viable etching technology for advanced microelectronics device manufacturing. It offers high etch selectivities and reduced irradiation damage due to the moderate to low average ion energies (e.g. <100eV).

Figure 2:
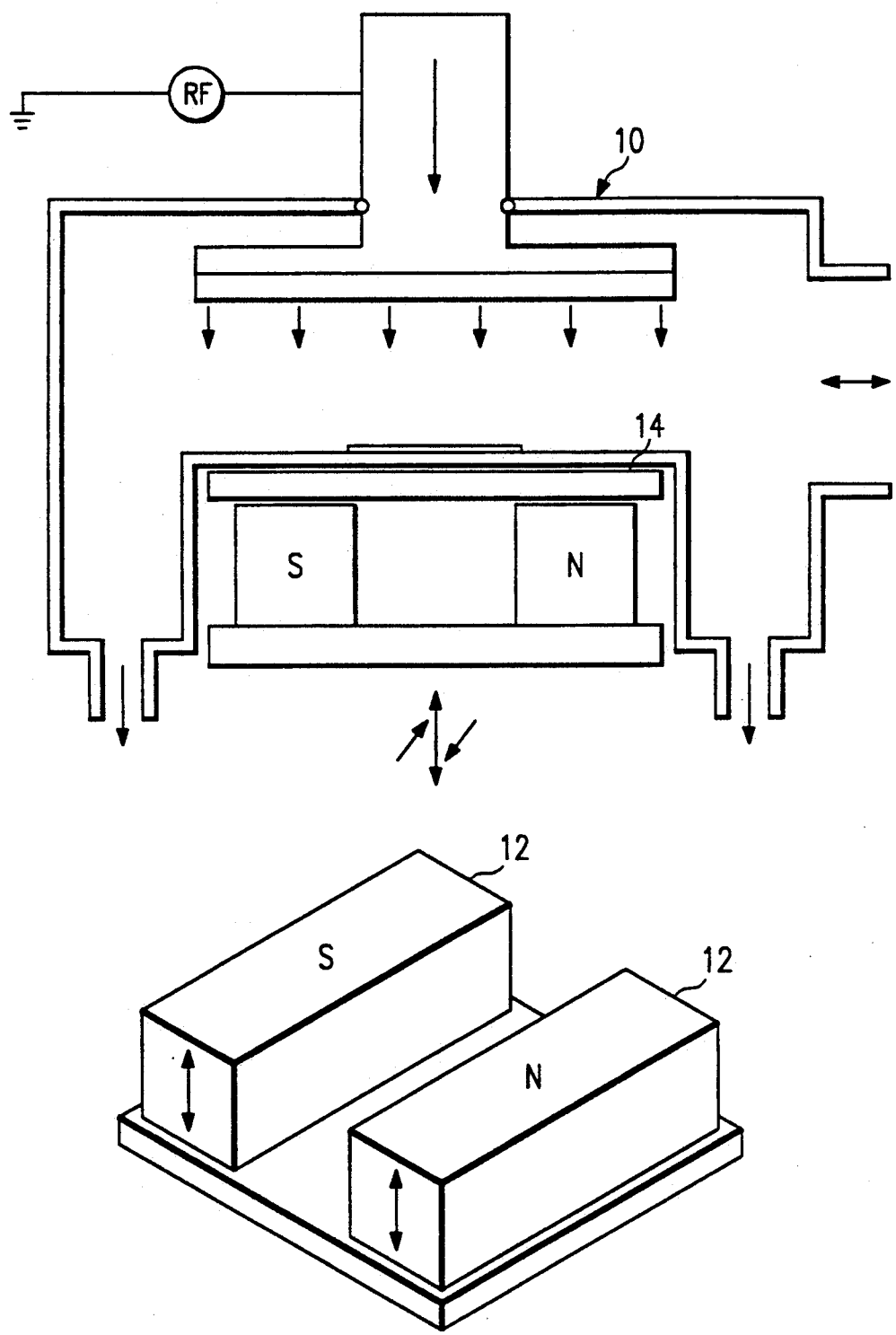
FIG. 2 shows a schematic view of a conventional magnetron-plasma-enhanced processing module using two straight magnet bars under the wafer stage.

FIG. 2 illustrates a conventional parallel-plate magnetron-assisted RF plasma processing module 10 using a pair of permanent magnet bars 12. The magnets 12 are placed under the substrate stage 14 and are rotated for improved process uniformity. This conventional magnetron plasma module design does not provide any magnetic field distribution adjustment capability. Moreover, the module design is not easily scalable for use in larger reactors with larger semiconductor wafers. Using this conventional magnetron module, any process uniformity adjustments and optimizations are based on varying the process parameters such as the RF plasma power and/or process pressure. This is rather undesirable because these process parameters also affect the process throughout (etch or deposition rate) and selectivity in etch processes as well as film stress and quality in deposition applications. As a result, there is a need for a new magnetron plasma processing module which allows real-time process uniformity optimizations via adjusting the magnetic field strength and distribution in the region near the semiconductor wafer surface. The magnetron plasma processing of this invention offers this important feature and is also easily scalable for various semiconductor wafer and plasma processing reactor sizes.

Figure 3:
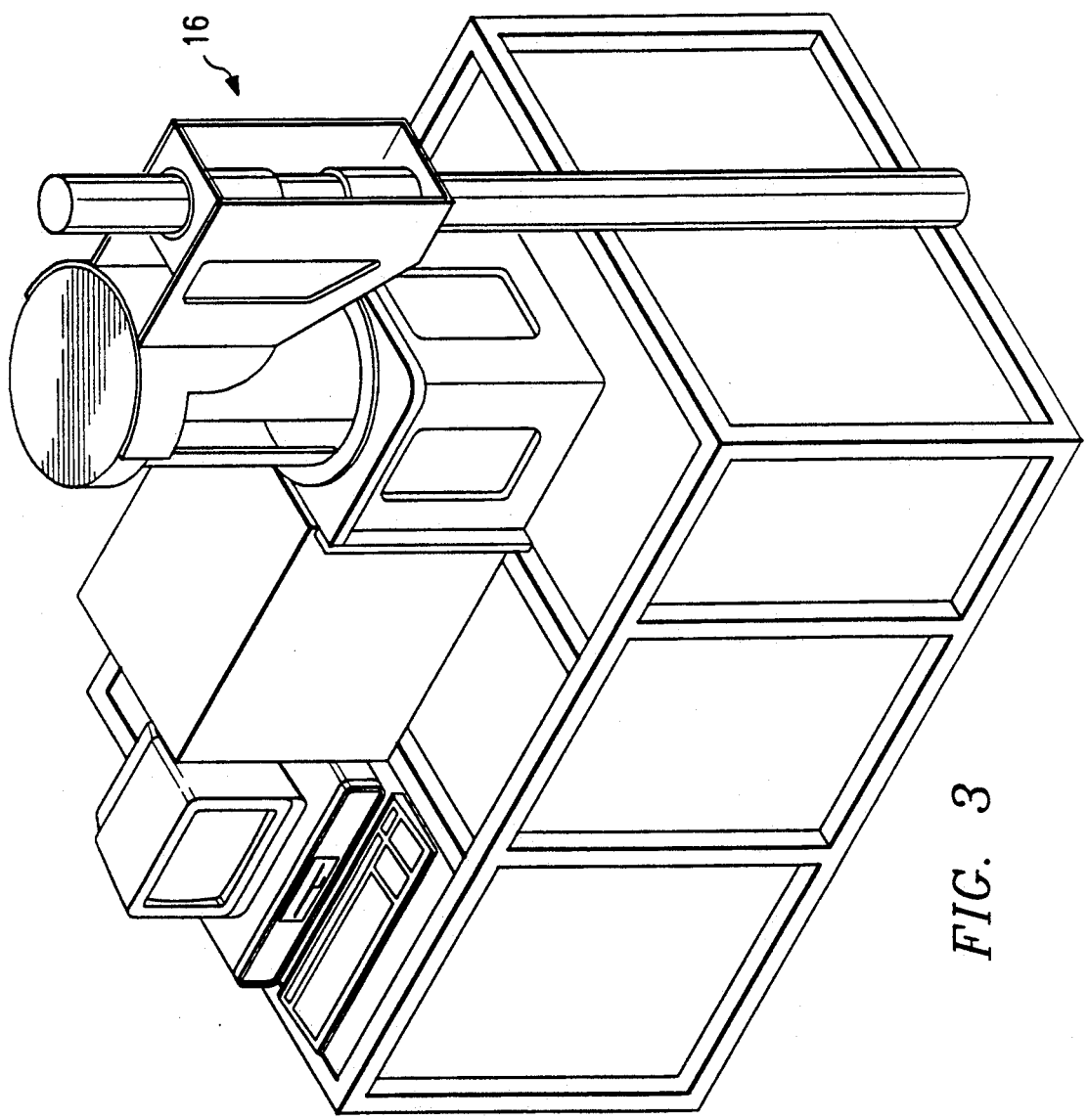
FIG. 3 illustrates a three-dimensional view of the magnetron-plasma processing reactor of a preferred embodiment of the present invention used with an automated single-wafer low-pressure plasma processing reactor with face-down wafer processing.

FIG. 3 illustrates a schematic 3-dimensional view of the magnetron-plasma-enhanced processing module of this invention on an automated vacuum processing (AVP) reactor 16.

Figure 4:
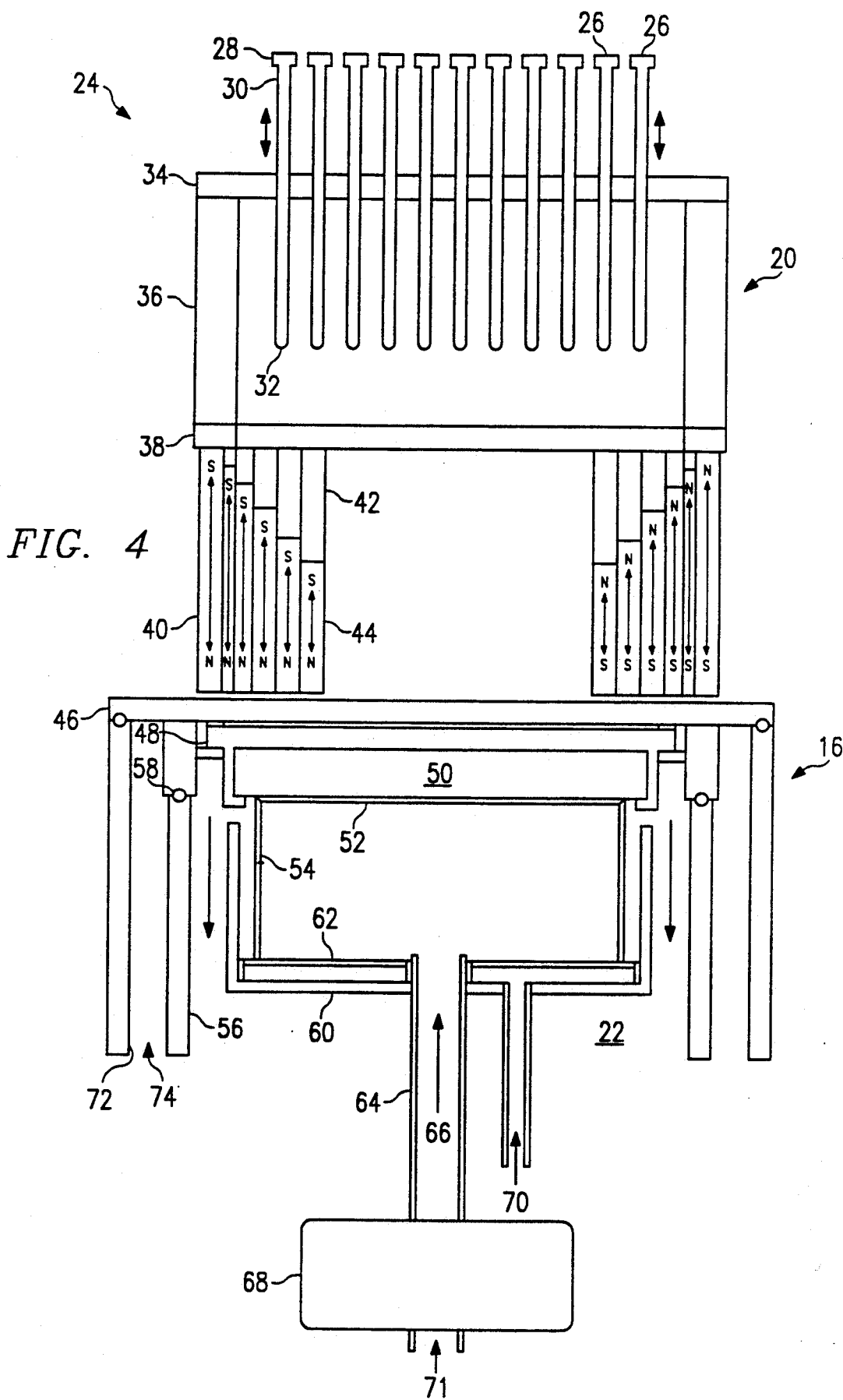
FIG. 4 shows a schematic cross-sectional view of a preferred embodiment of the magnetron-plasma-enhanced processing module of the present invention used with a single-wafer low-pressure plasma processing reactor with face-down wafer processing.

FIG. 4 illustrates the schematic side view of a single-wafer magnetron-plasma-enhanced automated vacuum processing (AVP) reactor 16 to show the proper placement of magnetron module 20 of the present invention on a plasma etch or CVD process chamber 22. The plasma processing system 24 of the present invention 16 basically includes permanent magnet magnetron module 20 which mounts on single-wafer process chamber 22. Magnetron module 20 includes adjustable iron pins 26, each of which comprises pin stop 28, pin shaft 30, and pin tip 32. Each pin tip 32 may connect to a small iron block termination (not shown) in order to enhance the field adjustment effects of the iron pins 26. Pins 26 adjustably couple to top plate 34. Top plate 34 attaches to support cylinder 36, which mounts to iron ring 38. Iron ring 38 integrally attaches to permanent magnet assembly 40. Magnetron permanent magnet assembly 40 comprises iron bars 42 and permanent magnet bars 44 both having predetermined geometries, sizes, and magnetic properties.

Process chamber 22 comprises water-cooled stainless steel vacuum base plate 46 which engages quartz support module 48. Quartz support module 48 firmly holds low thermal mass multipurpose chuck 50 in contact with semiconductor wafer 52. Quartz support module 48 provides thermal and electrical insulation between chuck 50 and vacuum base plate 46. Quartz wafer holding pins 54 (3 or 4 pins) support semiconductor wafer 52 (shown for facedown processing) against chuck 50. Process chamber wall or collar 56 seals to vacuum base plate 46 with process chamber vacuum seal 58. Anodized aluminum or stainless steel ground electrode 60 consisting of a flat plate and a cylindrical extension component surrounds wafer pins 54 and contains quartz or metallic gas shower head 62. Gas shower head 62 provides one path for process gas injection. Sapphire or quartz tube 64 provides a second gas injection path for remote microwave (or RF induction) plasma stream 66 to enter process chamber via ground electrode 60. Microwave cavity 68 surrounds sapphire or quartz discharge tube 64 which receives gas from gas inlet 71 to generate plasma stream 66. Auxiliary chamber wall 72 seals to vacuum base plate 46 and surrounds process chamber wall 56. This arrangement provides an improved vacuum integrity for process chamber due to the fact that the space between process chamber collar 56 and auxiliary chamber wall 72 is pumped down. The vacuum shield between process chamber collar 56 and auxiliary chamber wall 72 is also connected to the loadlock chamber vacuum (not shown).

The reactor design shown in FIG. 4 for deposition or etch system 16 employs a low thermal mass multipurpose RF chuck 50 which provides electrical contact between the wafer and an RF power source (not shown). Chuck 50 is also capable of heating and/or cooling the wafer for various CVD and etching applications. Semiconductor wafer 52 is placed face-down against the surface of RF chuck 50 during processing and the permanent magnet module 20 is positioned and centered on the top of the stainless steel vacuum base plate 46 which provides vacuum seal and supports the wafer chuck assembly (46 and 48) inside the process chamber 22. Although this particular configuration illustrates the magnetron module in use with a single-wafer reactor for face-down wafer processing, the magnetron module 20 of this invention is applicable to any format of wafer processing (face-up, face-down, or vertical).

The fabrication reactor of FIG. 4 can expose the semiconductor wafer to RF magnetron plasma, remote microwave plasma, or a hybrid combination of RF magnetron plasma and microwave plasma energy sources. Adjustable field magnetron module 20 on the top of the process chamber 22 generates a suitable magnetic field distribution around the semiconductor wafer 52 surface within the process chamber 22. All the material layers (stainless steel vacuum base plate 46, quartz support 48, and low thermal mass multi-purpose RF chuck 50) separating the wafer from the magnetron module 20 are nonmagnetic and do not affect or distort the magnetic field distribution on the wafer surface.

The spacing between the wafer 52 in process chamber 22 and the top of the stainless steel vacuum plate 46 is kept small (e.g. less than 1.25 inch) in order to enhance the maximum magnetic flux density and improve the process uniformity on the wafer 52 surface. Larger vertical spacings are possible and will require larger magnetron 20 diameters and higher energy permanent magnet materials. If necessary, magnetron module 20 can be moved vertically away from the stainless steel vacuum plate 46 and wafer 52 in order to reduce the magnetic field strength on the wafer. Moreover, the magnetron assembly 20 can be rotated (e.g. 10–60 rpm rotation speed) during wafer processing in order to enhance process uniformity and minimize the $\overline{EX} \overline{B}$ ion drift effects.

Figure 5:
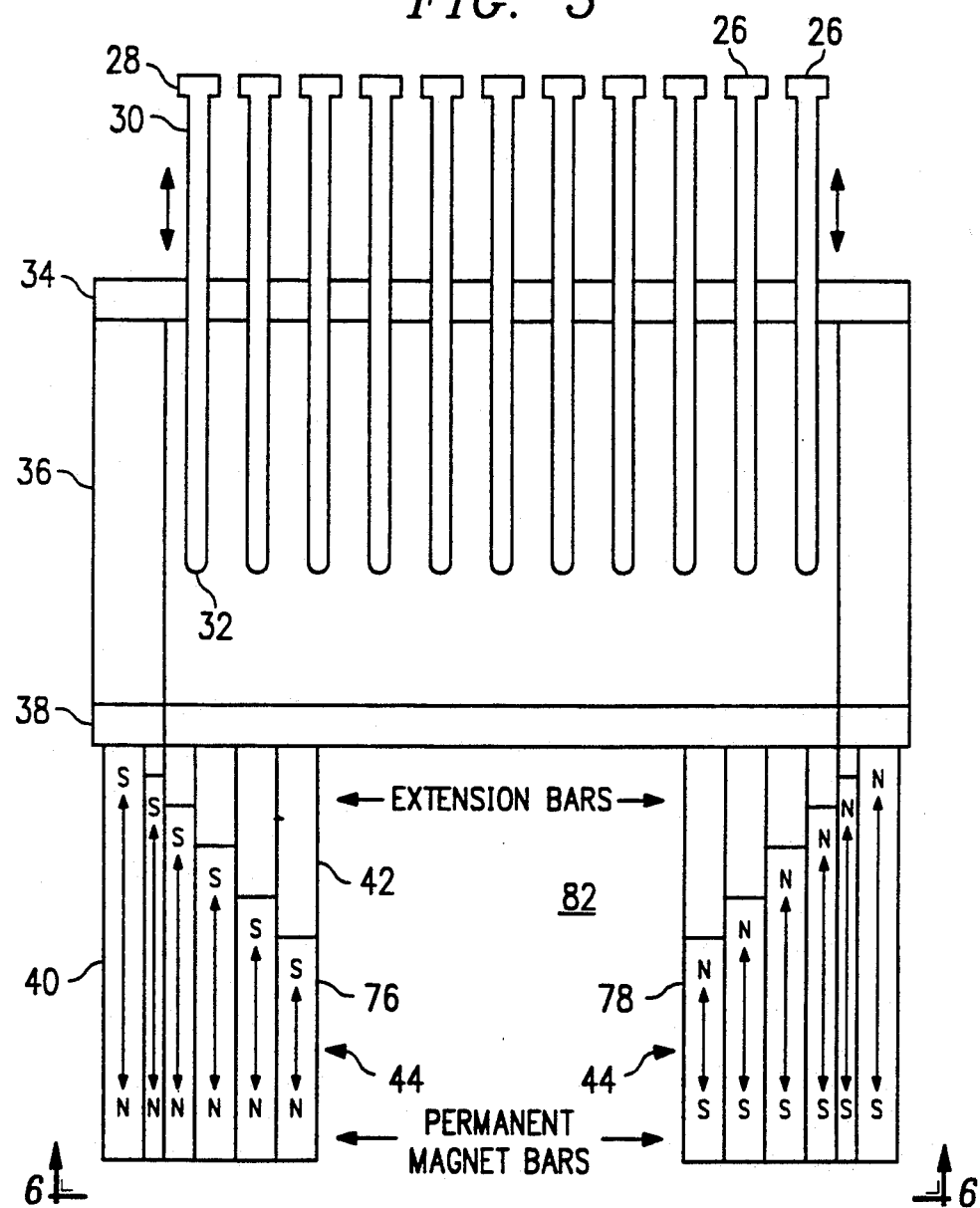
FIG. 5 shows the cross-sectional schematic side view of a preferred embodiment of the permanent magnet assembly of the magnetron-plasma-enhanced processing module of the present invention.

FIG. 5 more particularly shows the cross-sectional schematic side view of magnetron module 20 (the magnet 40 views are shown in a superimposed format). Iron plate 34 sits on the top of the aluminum cylinder 36 and holds an array of iron pins 26 which are used for process uniformity adjustments and optimizations. Magnetron module 20 further consists of two separate groups 76 and 78 of permanent magnet bars and iron extension bars arranged around two arcs on a circle which attach to lower surface of an iron ring 38. The other side of the iron ring 38 connects to the hollow nonmagnetic cylinder 36 which has the same diameter as the iron ring 38. In the preferred embodiment of the invention, iron ring 38 is sufficiently thick (e.g. 0.5"–1.0" thick) in order to fully contain the magnetic flux lines emerging from the upper magnet poles by providing a magnetic short circuit path.

Figure 6:
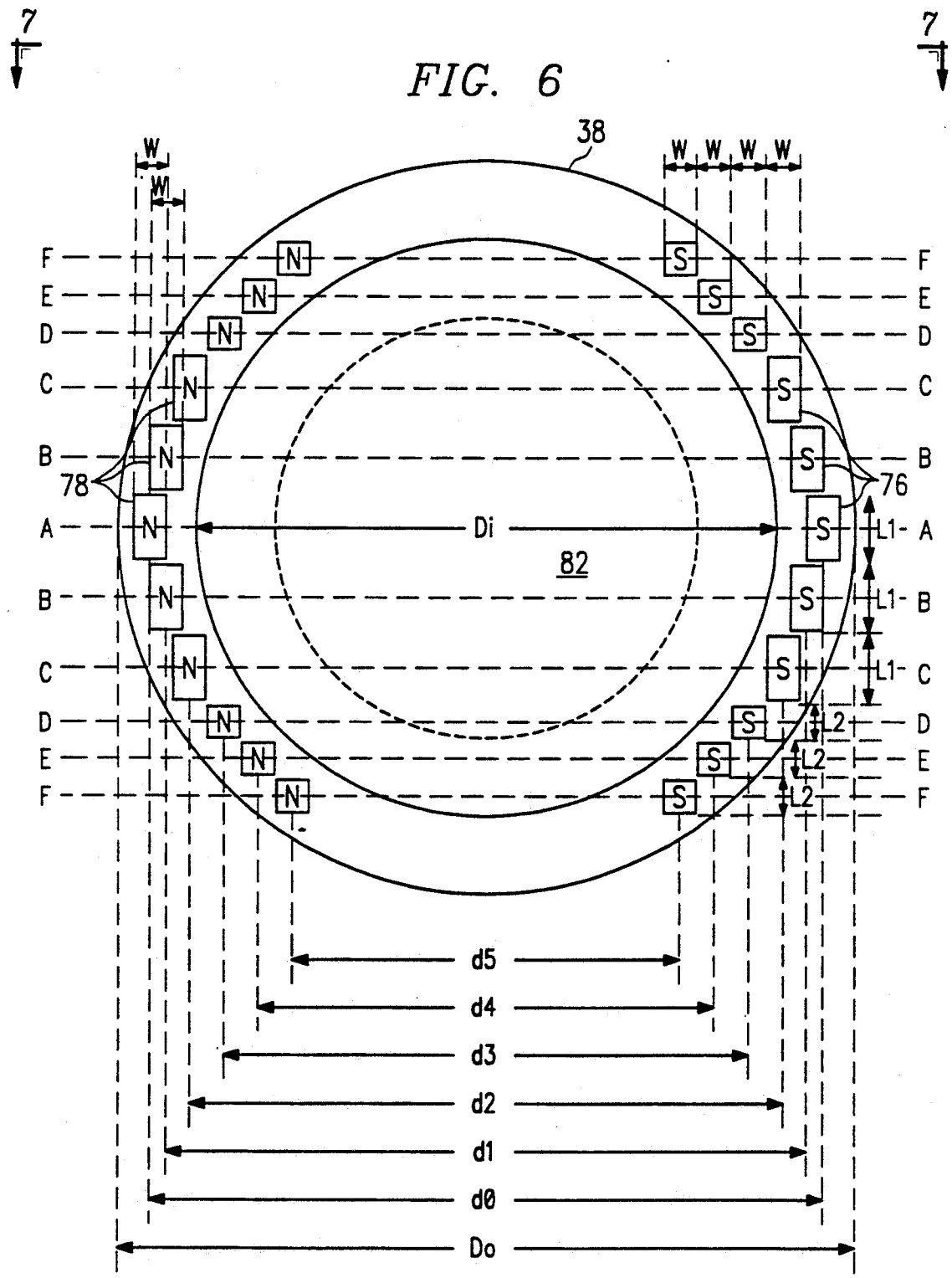
FIG. 6 shows a schematic plan view of the support iron ring and the placement of the permanent magnet bars, according to-a preferred embodiment of present invention.

FIG. 6 shows a schematic planar view of iron ring 38 and the two separate groups 76 and 78 of permanent magnet bars. The permanent magnet bar groups 76 and 78 attach to the iron ring 38 surface. In the preferred embodiment of the present invention, all the permanent magnets are made of high-energy rare-earth material and have rectangular or square cross sections. Circular or other shapes, however, will work equally satisfactory. Each permanent magnet is magnetized axially along its largest dimension (i.e., its height). The polarities of the magnets in the two groups (shown on the left and the right sides of the iron ring 38) are opposite to each other. This permits direct coupling or closure of the magnetic flux lines emerging from the free standing poles of the two groups 76 and 78 of permanent magnet bars. The iron ring 38 closes the magnetic flux lines on one side (outside process chamber). The magnetic flux lines on free-standing poles close via a space consisting of the semiconductor wafer and the near-wafer process environment.

According to FIG. 6, there are eleven permanent magnets in each group 76 and 78. However, it is possible to change the number of permanent magnets and use a smaller or a larger number of magnets in each group. The magnets of the present invention all have the same width (W). Depending on the magnetic field strength and distribution desired, however, magnets of groups 76 and 78 could easily have varying cross-sectional widths. Such magnet groups would clearly fall within the scope of the present invention. The inner diameter (Di) of the iron ring 38 is chosen to be larger than the diameter of the semiconductor wafer 52 to be processed (its projected image shown as a dotted circle) such that the entire wafer is properly exposed to a fairly uniform transverse magnetic field. The dimensions d0 through d5 correspond to the spacings between each pair of magnets which have identical heights and face each other (center-to-center spacing).

Figure 7:
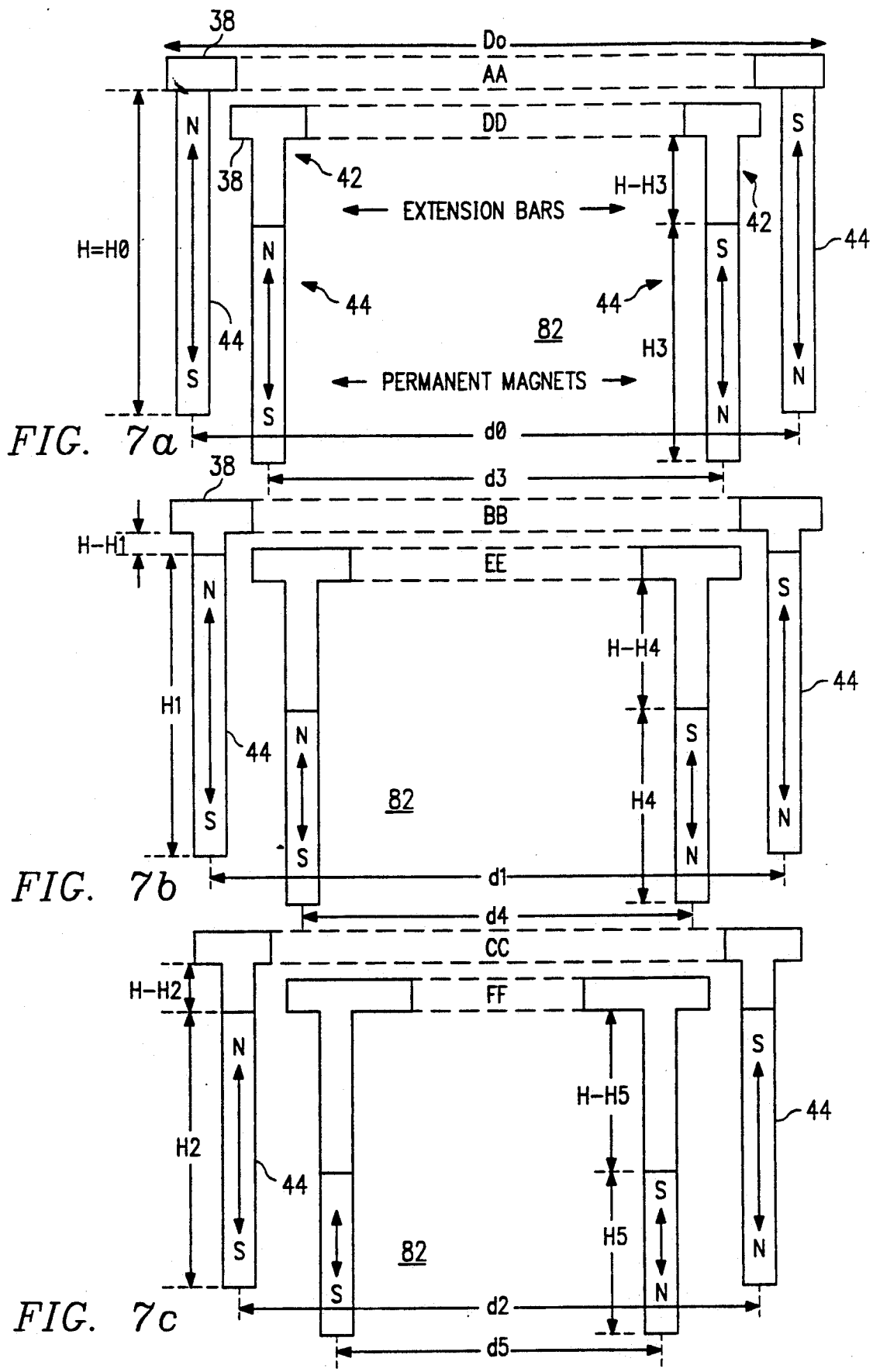
FIGS. 7a-7c shows various cross-sectional views of the module shown in FIG. 6 through several different vertical planes.

FIG. 7 shows six cross-sectional side views of the module shown in FIG. 6 through the different planes AA, BB, CC, DD, EE, and FF in FIG. 6. The magnetron module 20 structure is symmetrical with respect to the axis AA.

For the eleven pairs of magnets shown in FIG. 6, center-to-center magnets spacings, d0 through d5, vary for different pairs since the magnet pairs are distributed at different locations on the iron ring 38. As a result, d0 is the largest spacing while d5 is the smallest spacing between the magnets in various pairs. The cross-sectional views in FIG. 7 indicate that the magnet pair with the largest spacing (d0) has magnets with heights of H0 (i.e., the greatest height). The heights of the magnets in the other pairs should be scaled according to their inter-magnet spacings in order to achieve a fairly uniform transverse magnetic field distribution. Therefore, the pairs with inter-magnet spacings smaller than do should have shorter heights relative to the magnets 44 with heights equal to H0.

The vertical arrangement of the permanent magnets is such that the free standing poles of the magnets are all within the same imaginary flat plane. As a result, the shorter magnets are mounted on iron (or any other soft magnetic material) bars or extension pieces 42 in order to elevate the free poles to the same level as the tallest magnets and in order to provide a short-circuit path for the magnetic circuit on the opposite poles via the iron ring 38.

The geometrical dimensions of various components and the type of permanent magnets in magnetron module 20 depend on the process requirements and the physical dimensions of the plasma processing reactor. Some typical dimensions for magnetron module 20 components, however, are given as an example. These dimensions relate to the use of magnetron module 20 for 6-inch wafer processing. Iron ring 38, for example, has a thickness of 0.5 in., an outside diameter of 10 in., and an inside diameter of 8 in. These values are large enough to cover wafer 52 with a fairly uniform transverse magnetic field at distances of up to over 1"from the free-standing poles.

The following values are typical dimensions for the spacings and sizes of the magnets 44 and iron bars 42 of magnetron 20 (this example uses permanent magnets for illustrative purposes only):

MAGNET PAIR WITH SPACING OF d0

$d0 = 9.22$ in.
Cross-sectional area of the magnets $= 0.5 \times 1.0$ in.$^2$
Heights of the magnets $= H0 = H = 8.00$ in.
No extension iron bars used (magnets directly attached to iron ring).

MAGNET PAIRS WITH SPACING OF d1

$d1 = 8.75$ in.
Cross-sectional area of the magnets $= 0.5 \times 1.0$ in.$^2$
Heights of the magnets $= H1 = 7.60$ in.
Heights of the extension iron bars $= 0.40$ in.

MAGNET PAIRS WITH SPACING d2

$d2 = 8.00$ in.
Cross-sectional area of the magnets $= 0.5 \times 1.0$ in.$^2$
Heights of the magnets $= H2 = 6.94$ in.
Heights of the extension iron bars $= 1.06$ in.

MAGNET PAIRS WITH SPACINGS OF d3

$d3 = 7.00$ in.
Cross-sectional area of the magnets $= 0.5 \times 1.0$ in.$^2$
Heights of the magnets $= H3 = 6.08$ in.
Heights of the extension iron bars $= 1.92$ in.

MAGNET PAIRS WITH SPACINGS OF d4:

$d4 = 6.00$ in.
Cross-sectional area of the magnets $= 0.5 \times 1.0$ in.$^2$
Heights of the magnets $= H4 = 5.20$ in.
Heights of the extension iron bars $= 2.80$ in.

MAGNET PAIRS WITH SPACINGS OF d5

$d5 = 5.00$ in.
Cross-sectional area of the magnets $= 0.5 \times 0.5$ in.$^2$
Heights of the magnets $= H5 = 4.34$ in.
Heights of the extension iron bars $= 3.66$ in.

The heights of all the magnet components and extension iron bars can be scaled up by the same factor in order to increase the magnetic flux density without changing the field distribution shape.

Figure 8:
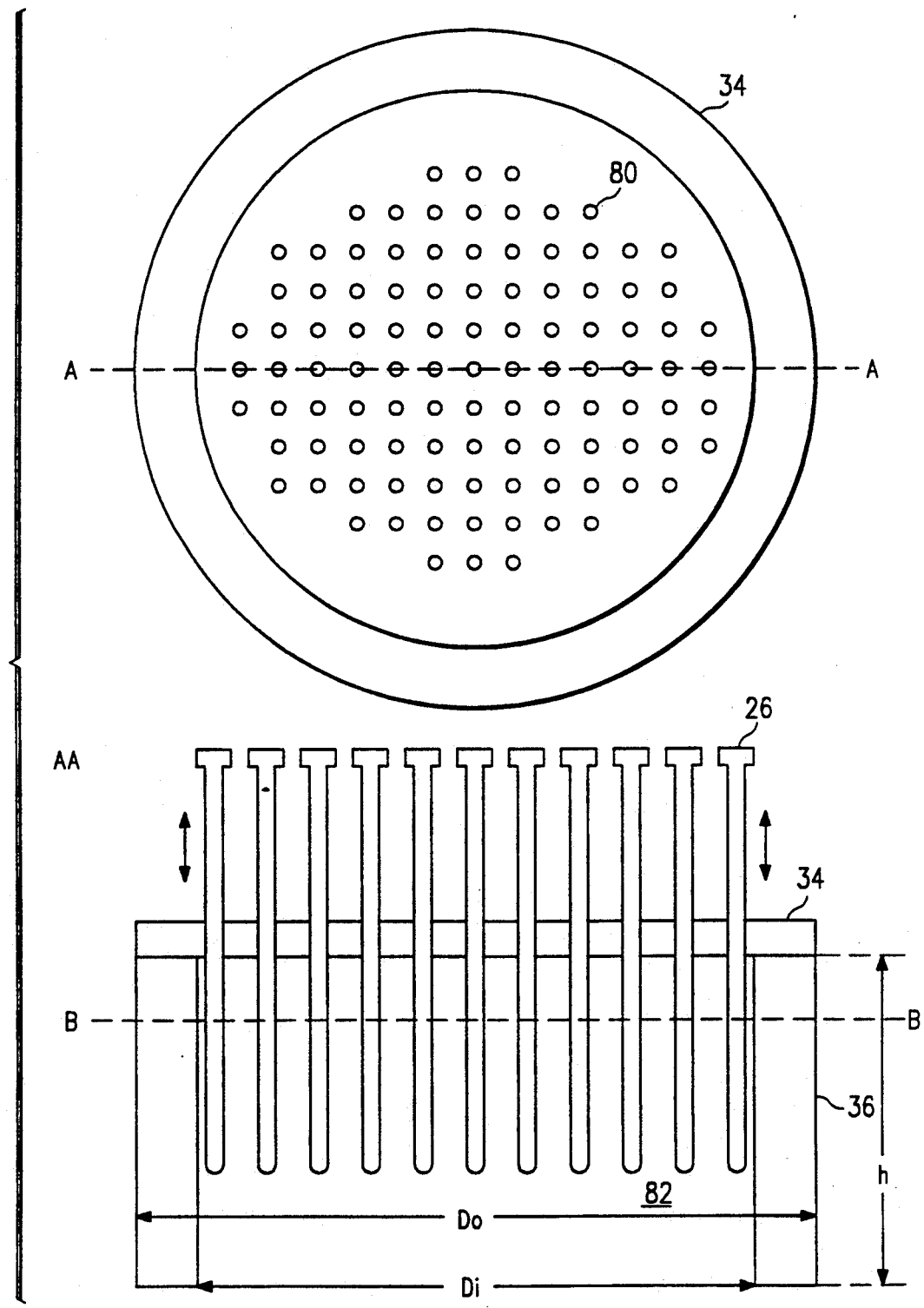
FIG. 8 illustrates schematic views of the magnetic field adjustment module of the present invention, including the magnetically conductive iron pin array.

FIG. 8 illustrates the schematic views of the magnetic field adjustment module, i.e., iron pins 26, top plate 34, and aluminum cylinder 36. This portion of module 20 employs a nonmagnetic hollow cylinder 36 which attaches to a top iron plate 34. Top iron plate 34 has a matrix of holes 80 to support the sliding iron pins 26. In the preferred embodiment of the present invention, cylinder 36 comprises an aluminum material and top plate 34 is a soft magnetic material such as iron.

Iron pins 26 connect to top plate 34 and iron pins 26 can move vertically in the plate holes 80. The position of iron pin tips 32 with respect to the horizontal plane of the magnet end poles orthogonal to permanent magnets 44 is adjustable. The proximity of any pin 26 tip to the plane of magnet poles within the magnetic field region will modify the magnetic flux distribution and strength near the wafer 52 surface. As a result, the three-dimensional distribution of the spacings of the iron pins from the free-standing poles can directly affect the three-dimensional distribution of the magnetic field around the magnet poles and near the wafer surface in the magnetron plasma processing environment.

In an alternative embodiment of the present invention, each pin tip 3 may also include an iron block termination for enhancing the degree to which a particular pin 26 affect the magnetron 20 magnetic flux distribution. The simplest form of magnetic field adjustment can be based on binary states for the position of the iron pin tips: each pin may be either fully retracted (no effect) or placed in the plane of poles (strong effect). Yet another alternative embodiment of the present invention would remove cylinder 36 so that top plate 34 rests directly upon iron ring 38 only. In this configuration, pins 26 would only reciprocate within bore 82 of permanent magnet assembly 40. This may be desirable depending on the necessary magnetic flux and reactor layout considerations.

The heights of aluminum cylinder 36 and iron pins 26 are selected such that (i) pins 26 do not disturb the magnetic field distribution when they are retracted all the way up through top plate 34 and (ii) pin tips 32 can reach the plane of the free standing poles of the magnets 44 when the pins 26 push all the way down through the top plate 34. Therefore, the height of the cylinder 36 of the preferred embodiment can be 2 inches. Both iron ring 38 and top plate 34 are 0.5-inch thick. As a result, iron pins 26 in the preferred embodiment are 11 inches high.

Each pin 26 includes a stop 28 for limiting movement of the pin 26 into the opening. A shaft 30 is connected to the stop 28 and has a length at least equalling the cylindrical height of the cylinder plus the height of the magnet assembly. A tip 32 is connected to the shaft 30 and associated to enter the bore for adjusting the magnetic field.

The permanent magnet heights, H0 through H5, were calculated according to the magnet spacings (magnet height directly proportional to the spacing between the two magnets in a given pair) and the maximum transverse magnetic flux density on semiconductor wafer. The type of the permanent magnets and their heights determine the magnetic flux density strength. Various materials such as alnico, ceramic, or high-energy rare-earth materials may be used for the permanent magnets. In some applications, ceramic permanent magnets are more economical and can meet the field strength requirements (up to a few hundred Gauss on the wafer surface). However, the preferred embodiment of this invention uses rare-earth permanent magnets.

Although the design example presented here was based on the assumption that the free-standing poles of the magnets are in the same plane, the design can be extended to include nonplanar situations where the magnet poles are not located in the same plane. Therefore, various geometrical dimensions can be adjusted in order to optimize the field distribution for different applications.

As stated above, numerous factors determine the necessary magnetic field strength from magnets 44. The following discussion outlines these factors. During MPE processing, chuck 50 is connected to an RF power source. The RF power generates a plasma and a self-induced negative DC bias between the plasma and the semiconductor wafer 52 surface on the chuck. As a result of the transverse component of the magnetic field, electrons within the plasma follow the magnetic field lines that magnetron module 20 produces. Because of the perpendicular electric field and the transverse component of magnetic field, the magnetron condition is satisfied which results in enhanced plasma density and confined plasma near the wafer surface. The magnetron plasma discharge is produced by electron drift motion due to crossed electric and magnetic fields. The self-induced DC voltage generates an electric field perpendicular to the cathode or wafer surface. Moreover, the externally applied static magnetic field produces the necessary transverse magnetic field component parallel to the cathode. The electrons experience a cycloidal motion along a path that parallels the semiconductor wafer 52 face. Because of the cycloidal motion, the electron collision probability and plasma ionization efficiency increases. This tends to increase the plasma density and ion current density at the semiconductor wafer surface. The radius of the cycloidal path is known as the "Larmor radius". The Larmor radius, R, of an electron with an energy of V in a uniform transverse magnetic field can be calculated from the following relationship:

$$R = 33.7 \frac{V^{0.5}}{B} \text{ mm} \quad (1)$$

where B is the transverse magnetic flux density in Gauss and V is the electron energy in electron volts.

As indicated above, the Larmor radius is reduced with increasing the transverse magnetic flux density and/or decreasing the electron energy. The cyclotron frequency, f, in which the electron rotates is proportional to the transverse magnetic flux density and increases linearly as the transverse magnetic field strength increases according to the following equation:

$$f = 2.80 \times 10^6 * B \text{ (cycles/sec)} \quad (2)$$

Also, as the transverse magnetic field strength increases, the self-induced negative DC bias decreases, and this causes electron energies to decrease. Thus, as the transverse magnetic field strength increases, the frequency increases, the Larmor radius decreases, and the average ion energy imparted on the semiconductor wafer is reduced.

In plasma processing applications, the magnetron enhancement effects due to the interaction of the plasma species with the magnetic field become significant when the Larmor radius, R, becomes less than the electron mean-free path, $l_e$. This ensures that the electrons are sufficiently confined along the magnetic field lines to enhance the plasma density and ionization efficiency via ionizing collisions with gas molecules.

The electron mean-free path, $l_e$, is inversely proportional to the plasma gas pressure (P in Torr) according to the following equation:

$$l_e = \frac{a}{P} \quad (3)$$

where a is a constant (units of Torr-cm). The value of "a" is a function of the particular gas composition within the process chamber and can be considered the "mean-free path coefficient" of the gas within the chamber. Thus, as the pressure increases, the mean-free path will decrease.

In order to assure that the Larmor radius is less than the electron mean-free path, the following equation which combines equations (1) and (3), establishes a lower limit for the required transverse magnetic flux density.

$$B\text{min} = 3.37 \frac{PV^{0.5}}{a} \text{ Gauss} \quad (4)$$

Therefore, higher process pressures and higher electron energies will require stronger magnetic flux densities for enhanced MPE processing efficiency. For typical process pressures and electron energies, the required magnetic flux density will be around 50-500 Gauss. Most magnetron-ion etching processes employ process pressures in the range of 1-20 mTorr for maximum etch anisotropy or zero undercut. However, the magnetron-plasma-assisted deposition processes may employ process pressures over a much wider range (e.g. up to several Torr).

Design features that affect the magnetic field distribution uniformity and field strength include the thickness of chuck 50. The greater the chuck 50 thickness, the greater the necessary magnetic field strength needed to penetrate the chuck and provide the necessary magnetron enhancement for plasma formation at the semiconductor wafer 52 surface. Moreover, larger chuck thickness require larger permanent magnet assemblies in order to reduce the transverse field nonuniformities. Therefore, for optimal use of the adjustable field magnetron module of this invention, a new low thermal mass RF chuck has been invented. This new multipurpose chuck 50 is hereinbelow described. Also, the new and novel chuck is disclosed and described in U.S. patent application Ser. No. 07/565/765, entitled "Multipurpose Low Thermal Mass Chuck for Semiconductor Processing Equipment" by Moslehi, filed concurrently with this application. The disclosure and claims of that U.S. patent application are hereby expressly incorporated by reference.

Figure 9:
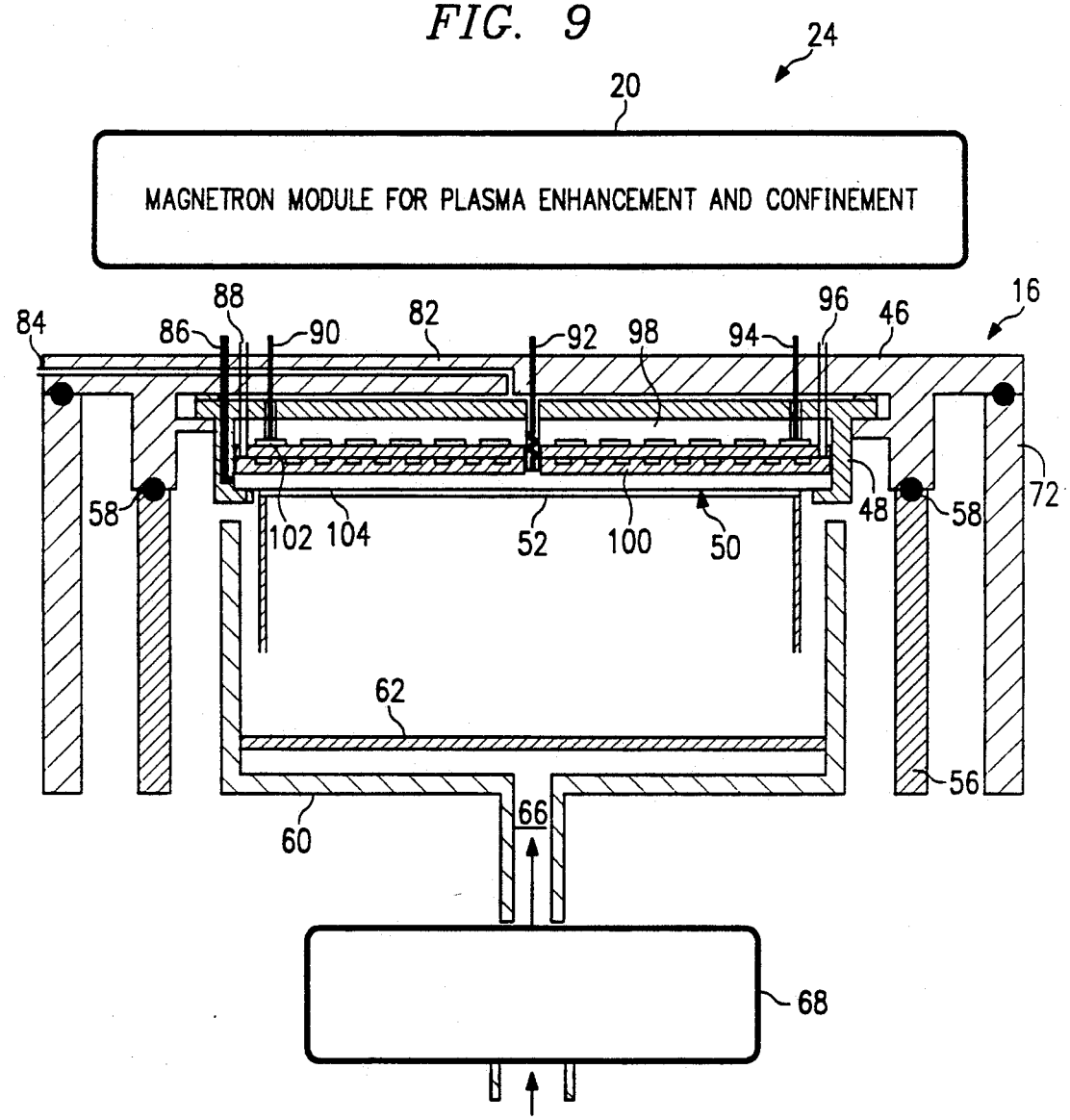
FIG. 9 shows a schematic cross-sectional view of the low thermal mass thin multipurpose chuck to be used with the magnetron module of the present invention.

FIG. 9 shows a partially broken away diagrammatic view of multipurpose chuck 50 and more particularly illustrates its connections from within chemical-vapor deposition (CVD) system 24. According to FIG. 9, magnetron module 20 mounts above stainless steel vacuum base plate 46 and multipurpose chuck 50 outside of process chamber 22. Stainless steel support vacuum base plate 46 engages quartz chuck ring 48. Beginning at the upper left portion of FIG. 9 beneath magnetron module 20, inert gas purge line 84 comprises a bore 82 through vacuum plate 46. RF contact 86 penetrates through vacuum plate 46 via an RF feed through and connects to RF plate of multipurpose chuck 50. Coolant inlet 88 connects through vacuum plate 46 to the interior of chuck 50. Heater wire 90 electrically connects (via an electrical feed through) through vacuum plate 46 to chuck 50. Spring-loaded thermocouple 92 takes a temperature signal from chuck 50. Heater wire 94 taps from chuck 50 and exits through vacuum plate 46 (via another electrical feed through). From the interior of chuck 50, coolant outlet 96 begins and continues through vacuum plate 46. Auxiliary chamber walls 72 seal to vacuum plate 46 and surround process chamber 22. Within auxiliary chamber walls 72, vacuum plate 46 seals to process chamber wall 56 at chamber vacuum seal 58. If necessary, all the chuck feed throughs can be made at the center with proper thermal and electrical insulations. The coolant, heater, thermocouple, inert gas and RF power connections may all run from the center of the chuck via the center of the magnetron module. Moreover, as explained later, the chuck coolant block may employ multiple (two) inlets and multiple (two) outlets. The chuck coolant lines can be connected to grooves made in the vacuum base plate 46 in order to use the vacuum base plate 46 as a heat exchanger.

Basic elements of multipurpose chuck 50 include cooling module 98 which incorporates coolant tunnels 100. Heating element 102 is separated from the cooling module 98 by a thin thermally conducting electrically insulating boron nitride wafer (not shown) and makes electrical contact with heater wires 90 and 94. RF plate 104 integrally connects to a thermally conducting electrically insulating boron nitride wafer (not shown) at the bottom side of cooling module 98 opposite that of heating element 102 and connects to RF contact 86. Semiconductor wafer 52 is clamped against the RF plate 104 and quartz wafer holding pins 54 hold wafer 52 in place inside the plasma processing module. Other components operate and connect as described in connection with FIG. 9.

Figure 11:
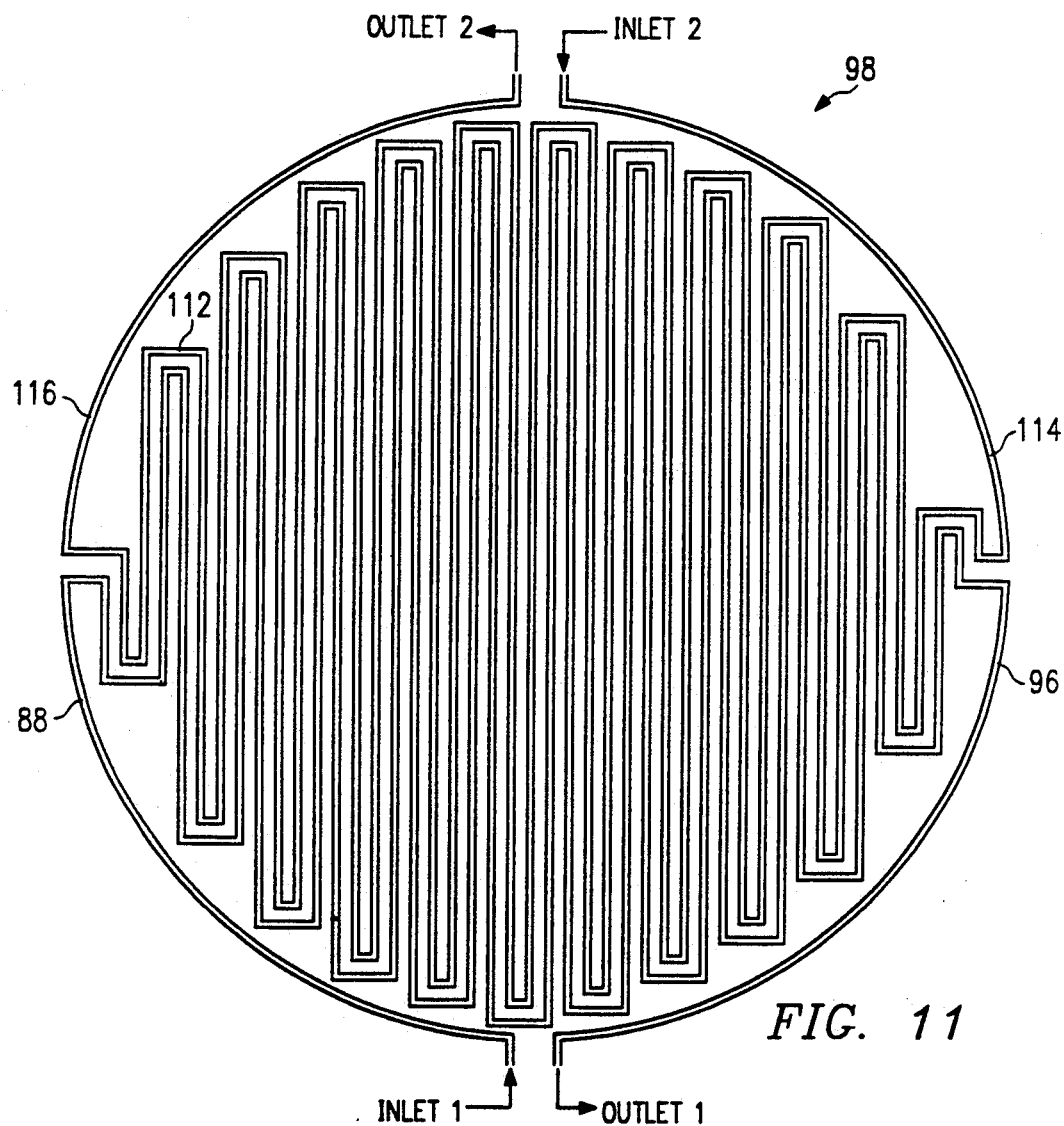
FIG. 11 provides a planar view of the coolant groove pattern of the multipurpose chuck coolant module of FIG. 9.
Figure 10:
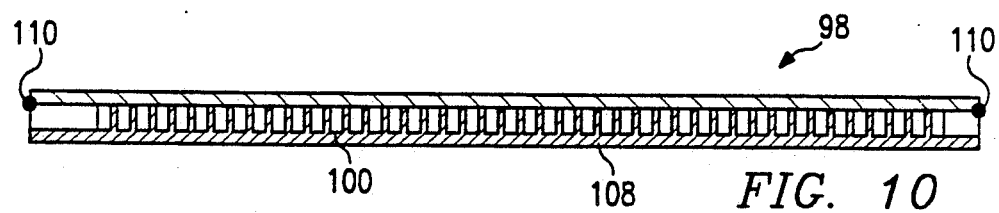
FIG. 10 is a cross-sectional view of the multipurpose chuck coolant module of FIG. 9.

FIGS. 10 and 11 more particularly show the construction of cooling module 98 within chuck 50. FIG. 10 is a cross-sectional schematic view of coolant module 98 showing it to comprise a top metal (such as aluminum or copper or nickel or molybdenum) plate 106 and a bottom metal plate 108 made of a similar material as the to plate. Bottom metal plate 108 mechanically seals to top metal plate 106 at welded joint 110 and contains coolant tunnels 100.

FIG. 11 provides a planar view of a suggested groove pattern in the bottom plate 108 that demonstrates the metal groove pattern 112 for coolant flow through coolant tunnels 100. In bottom plate 108 there are two separate sets of coolant tunnels 100. One set uses coolant inlet 88 and coolant outlet 96 (also shown in FIG. 9), another uses coolant inlet 114 and coolant outlet 116 (not shown in FIG. 9). The combination of these two coolant tunnels is expected to result in uniform, transient and steady-state wafer cooling using a gas cooling medium such as compressed air or helium or a liquid coolant. Various other coolant groove patterns may be used. The coolant module may be made of anodized aluminum (for a low-temperature chuck) or nickel-plated copper (for a high-temperature chuck). Other choices of coolant module materials include refractory metals such as nickel or molybdenum. If anodized aluminum is used in the cooling module 98, the chuck can be used over a temperature range of $-150°$ C. to $+500°$ C. On the other hand, nickel, molybdenum, or copper extend the upper temperature limit to beyond 850° C.

Figure 13:
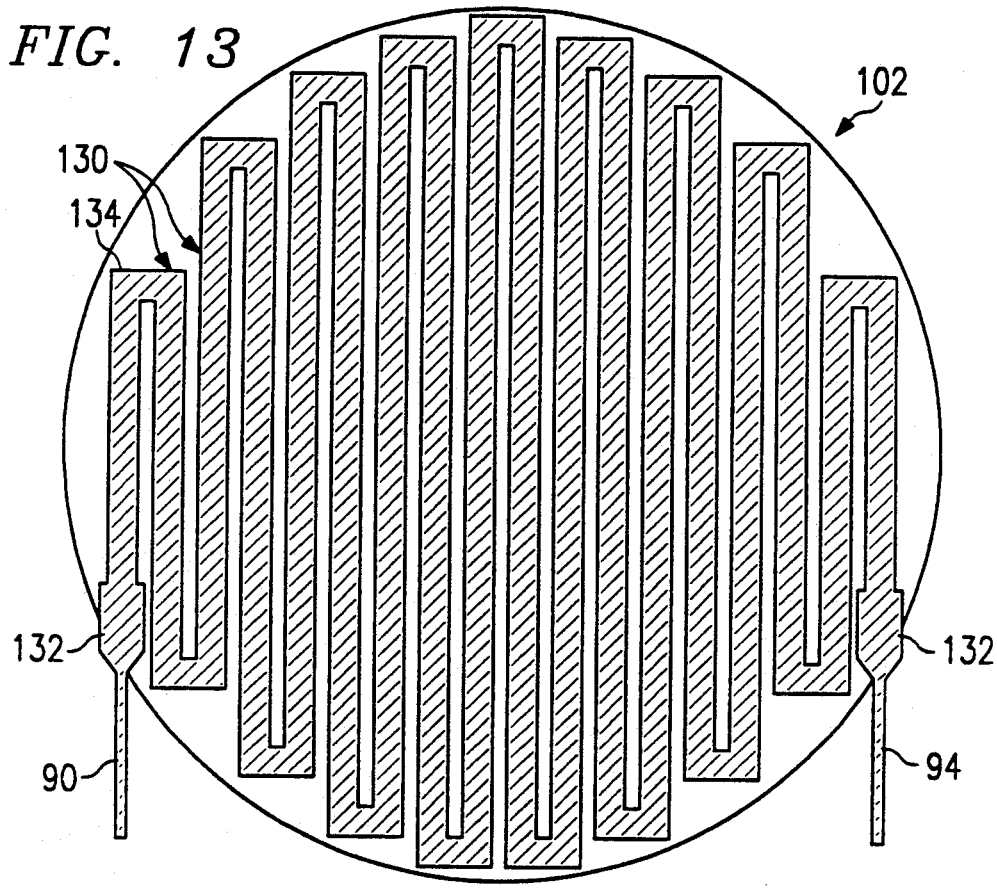
FIG. 13 shows a planar view of the heating element for multipurpose chuck of FIG. 9.
Figure 12:
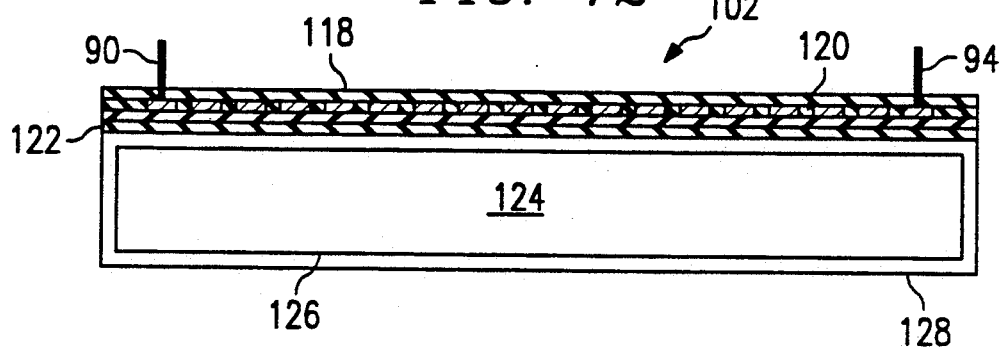
FIG. 12 is a cross-sectional view of the resistive heating element of the multipurpose chuck of FIG. 9.

FIGS. 12 and 13 show the construction of heating element 102. FIG. 12 is a cross-sectional view of heating element 102 exhibiting top layer 118 of electrical insulation and passivation through which heater wires 90 and 94 contact resistor line 120. Bottom layer 122 of electrical insulation integrally joins top layer 118 and heater substrate wafer 124. Heater substrate wafer 124 comprises graphite wafer 126 which SiC-coating 128 surrounds. FIG. 13 shows a planar view of top layer 118 and displays the pattern 130 that thinfilm power resistor line 20 makes to form power heating resistor 134. Contact 132 provides electrical connection between heater wire 90 and resistor line 120. The heater substrate 124 may be also made of boron nitride or even quartz. Boron nitride is a good choice of heater substrate material because of its high thermal conductivity and electrical insulation.

Figure 14:
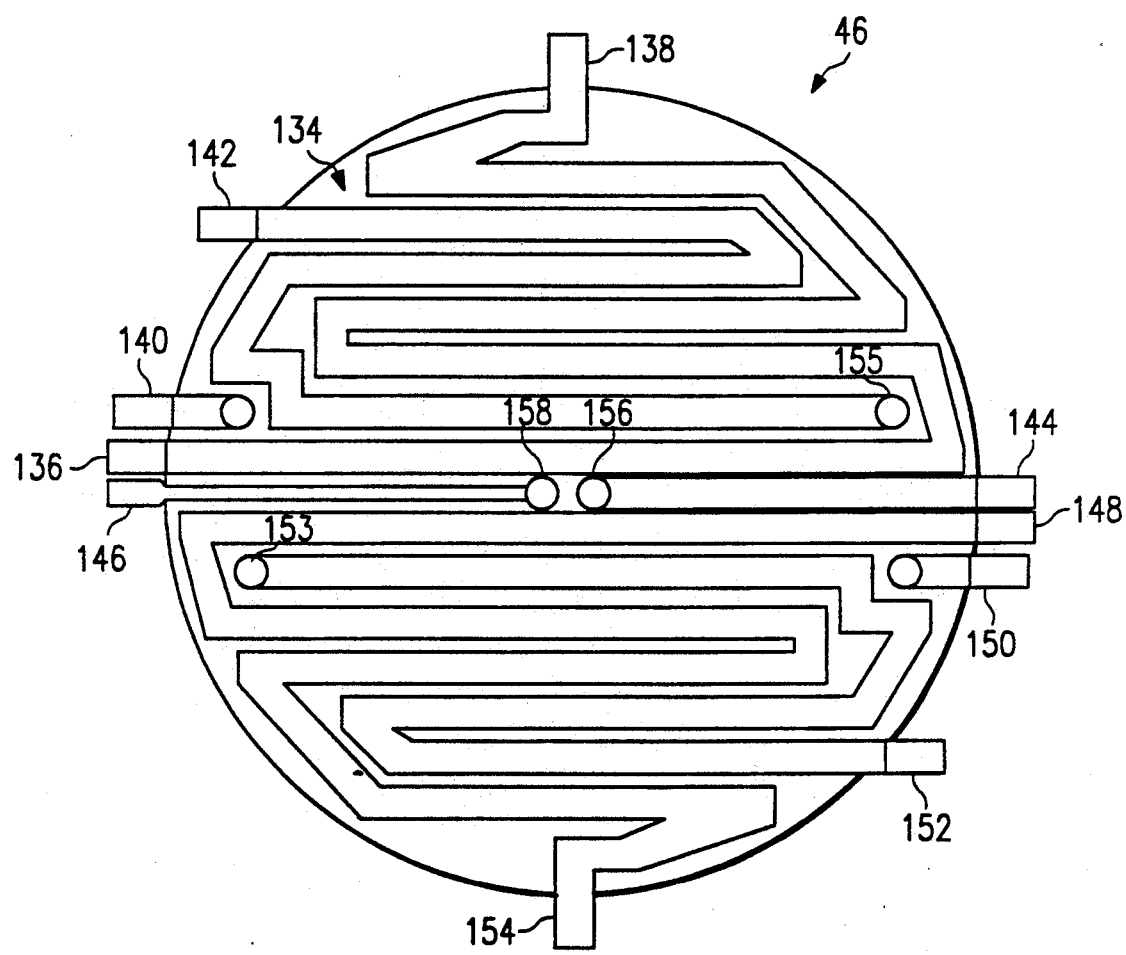
FIG. 14 shows a planar view of a preferred embodiment of the stainless steel support vacuum base plate of the multipurpose chuck of FIG. 9 (also indicating the groove pattern)
Figure 15:
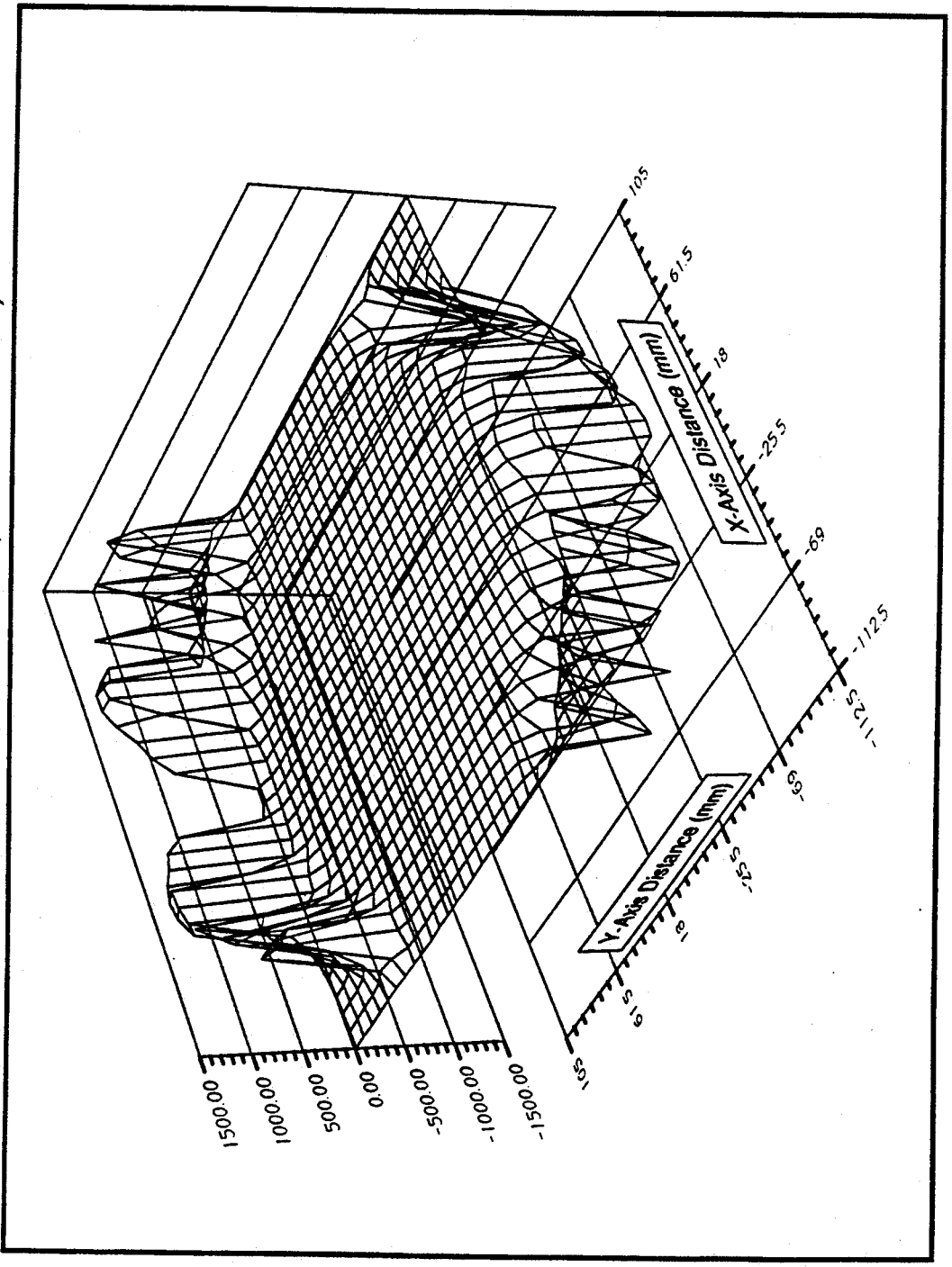
FIG. 15 shows a three-dimensional plat of the measured flux distribution density resulting from a preferred embodiment of the present invention (axial or "z" component of the magnetic field at a plane which is 1-2 mm away from the plane of magnet poles)
Figure 16:
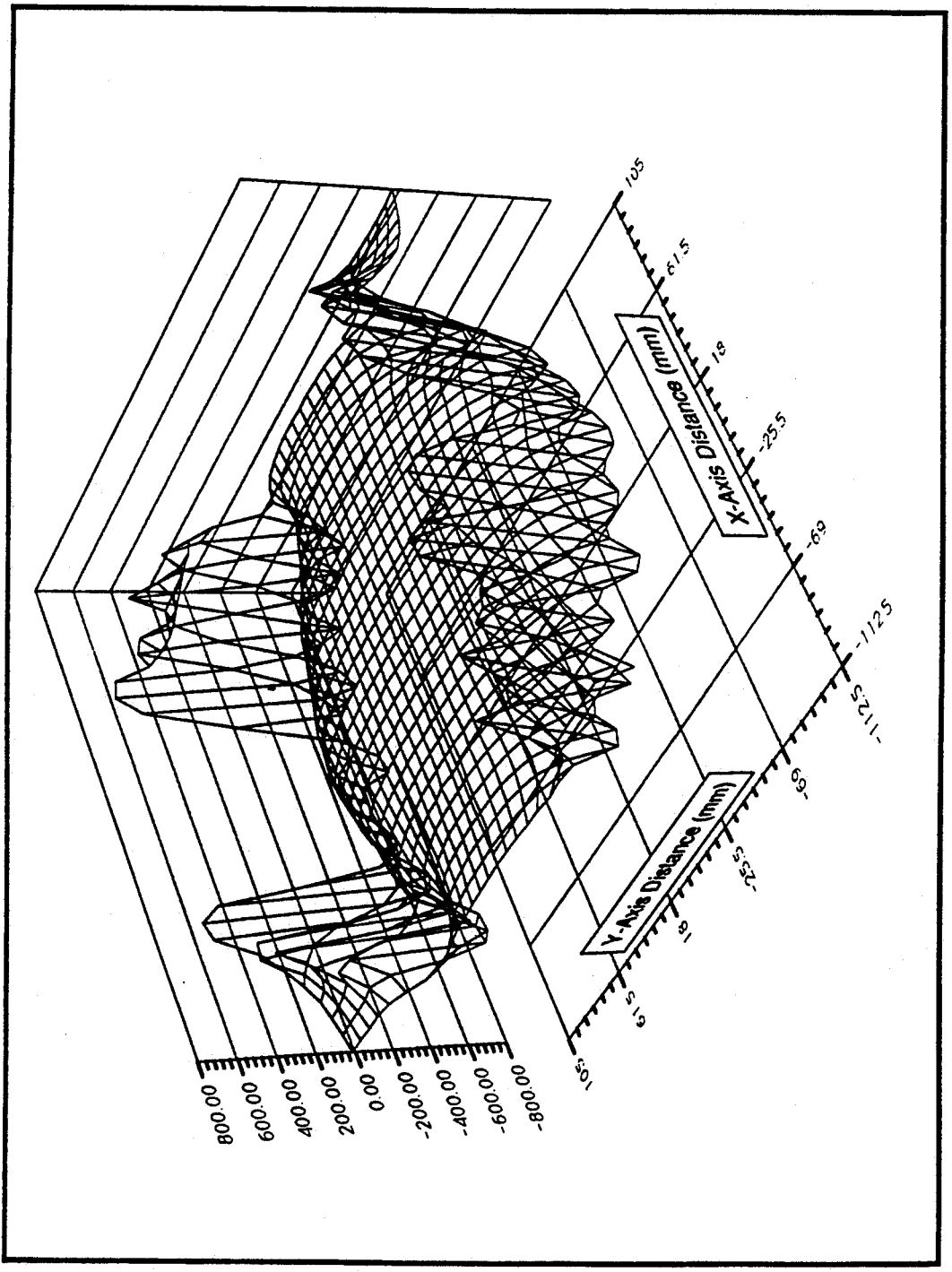
FIG. 16 shows a three-dimensional plot of the measured flux distribution density resulting from a preferred embodiment of the present invention (transverse "y" component of the magnetic field at a plane which is 1-2 mm away from the plane of magnet poles)
Figure 17:
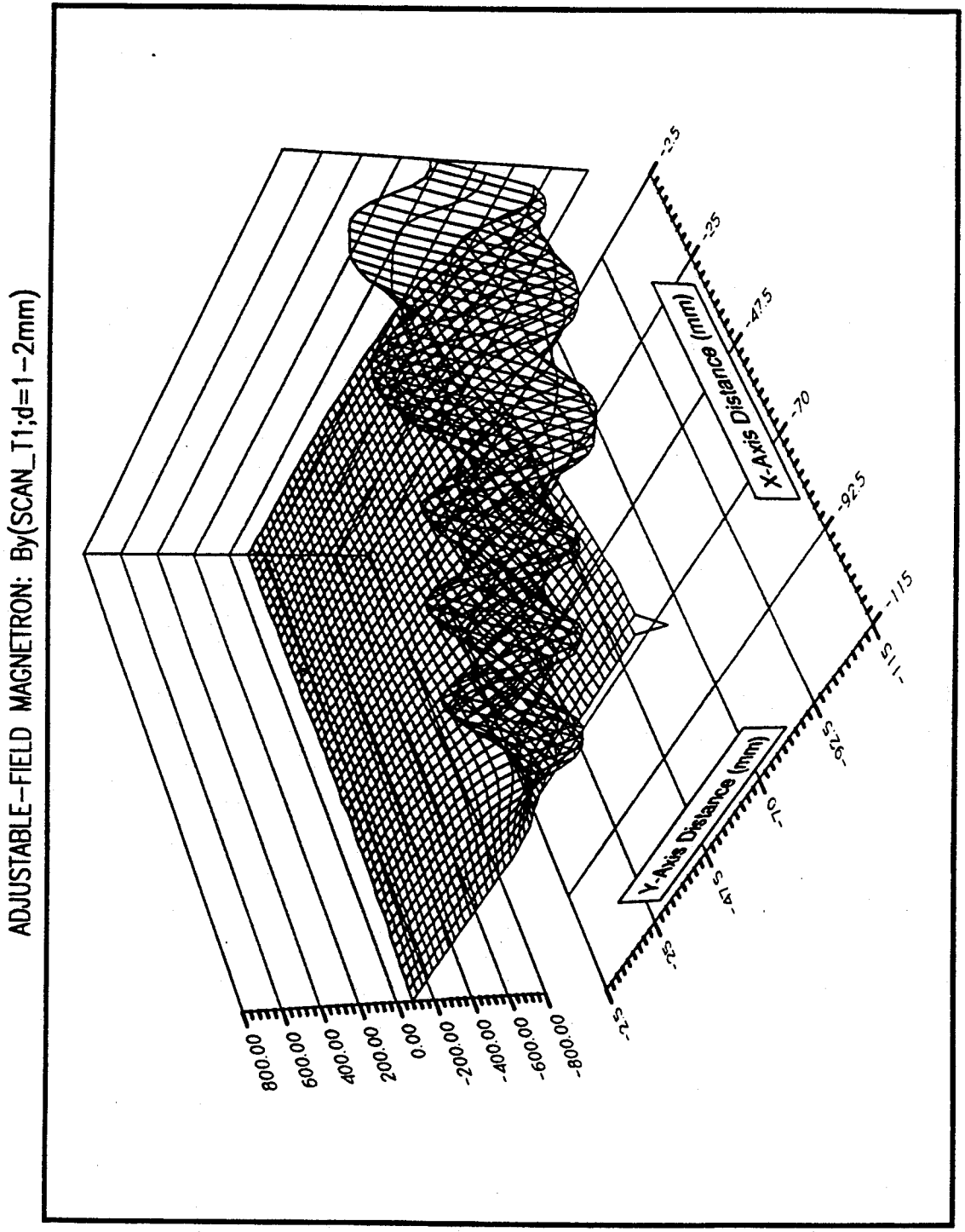
FIG. 17 shows a three-dimensional plot of the measured flux distribution density (over about one-quarter of the magnetron) resulting from a preferred embodiment of the present invention transverse ("x" component of the magnetic field at a plane which is 1-2 mm away from the plane of magnet poles)
Figure 18:
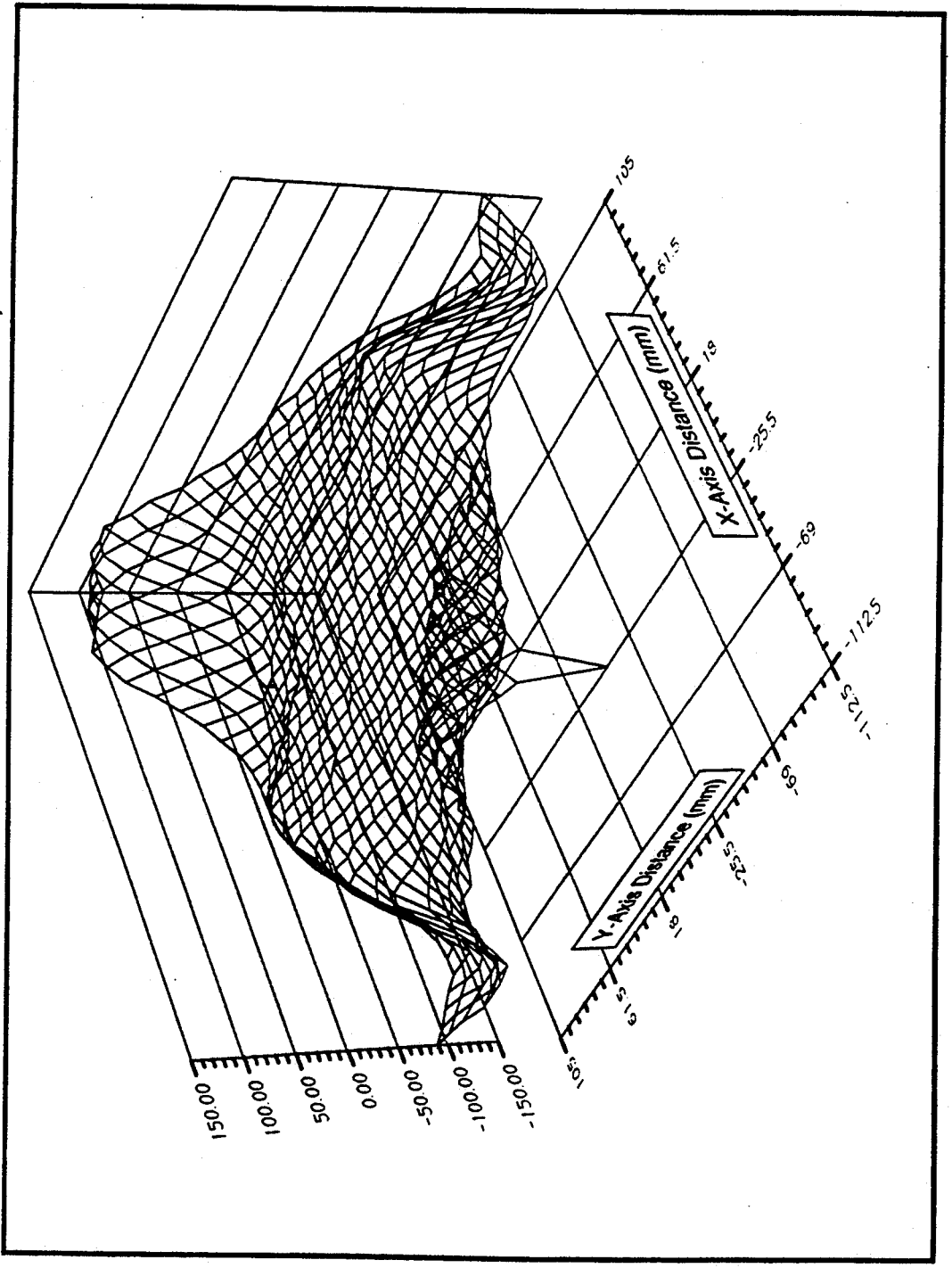
FIG. 18 shows a three-dimensional plot of the measured flux distribution density resulting from a preferred embodiment of the present invention (transverse "x" component of the magnetic field at a plane which is 19 mm away from the plane of magnet poles)
Figure 19:
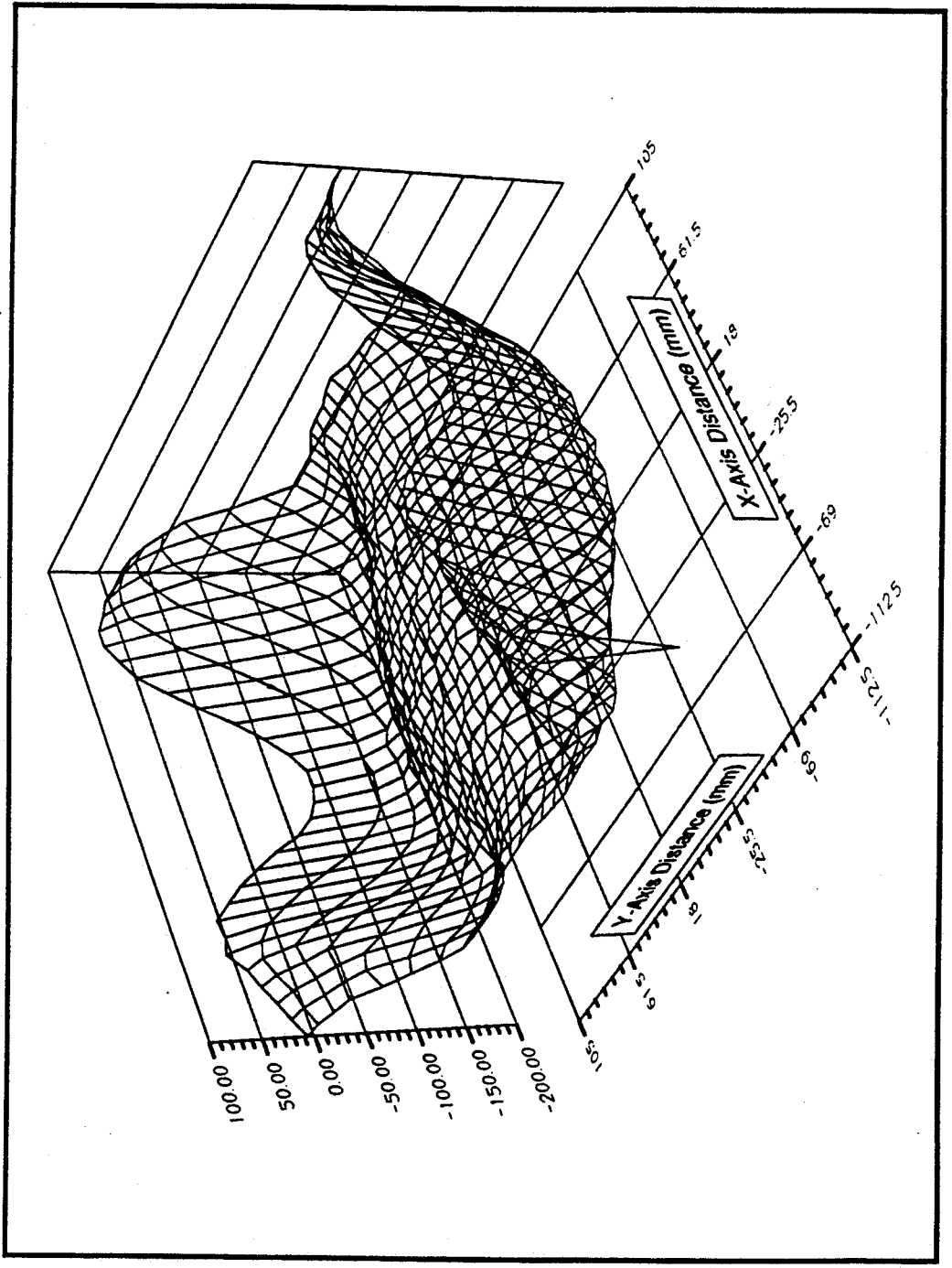
FIG. 19 shows a three-dimensional plot of the measured flux distribution density resulting from a preferred embodiment of the present invention (transverse "y" component of the magnetic field at a plane which is 19 mm away from the plane of magnet poles)
Figure 20:
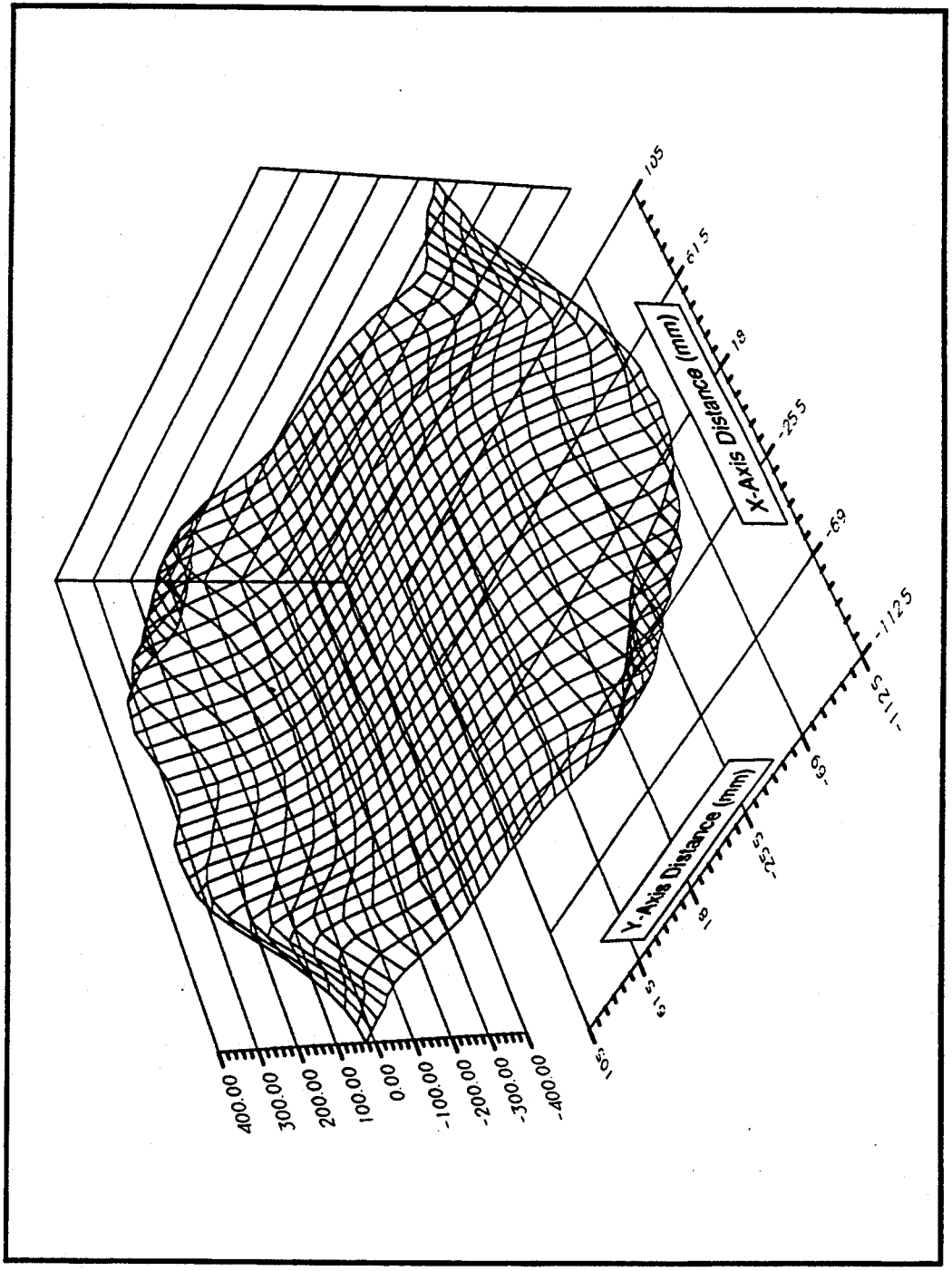
FIG. 20 shows a three-dimensional plot of the measured flux distribution density resulting from a preferred embodiment of the present invention (axial or "z" component of the magnetic field at a plane which is 19 mm away from the plane at magnet poles)
Figure 21:
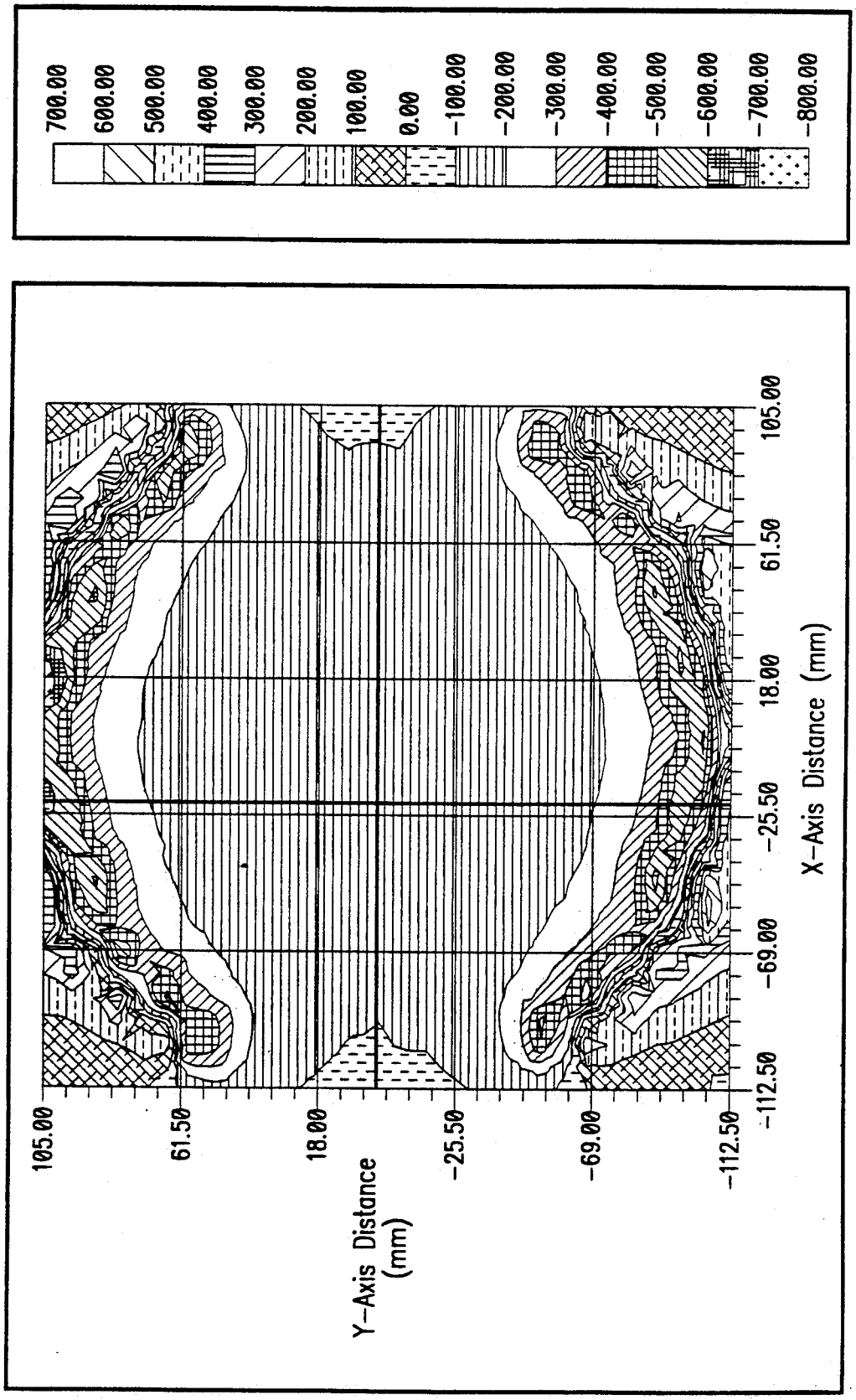
FIG. 21 shows a contour plot of the measured flux distribution density resulting from a preferred embodiment of the present invention (transverse "y" component of the magnetic field at a plane which is 1-2 mm away from the plane of magnet poles)
Figure 22:
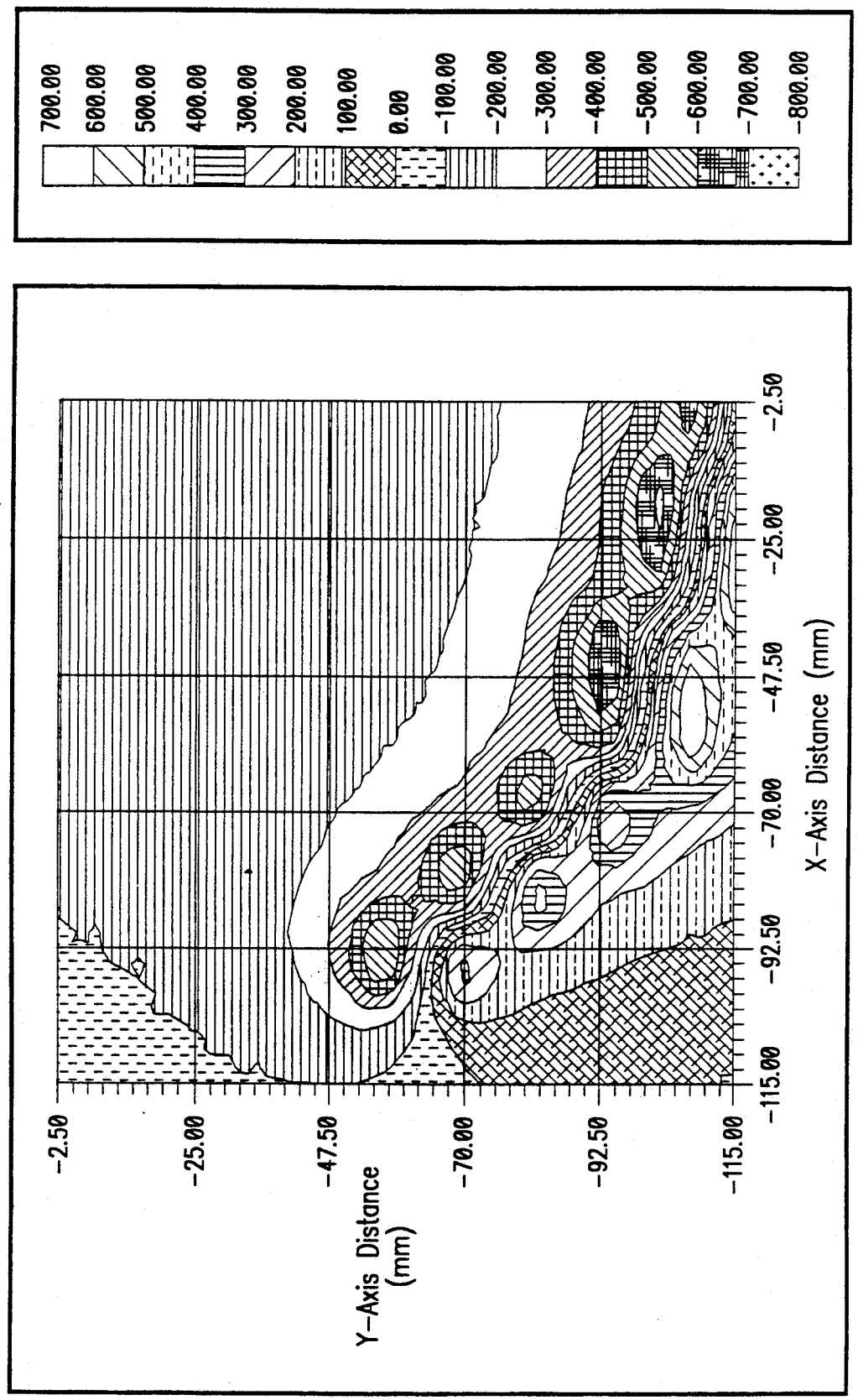
FIG. 22 provides a contour diagram of the measured magnetic flux density distribution (over about one-quarter of the magnetron surface area) resulted from a preferred embodiment of the present invention (transverse "y" component of the magnetic field at a plane which is 1-2 mm away from the plane of magnet poles)

FIG. 14 shows a planar view of the water cooling and chuck coolant groove pattern on the lower section of the stainless steel vacuum base plate 46. Grooves 134 cover vacuum plate 46 for both chuck coolant (air or helium) and base plate water cooling. Moving clockwise, at the left center side of FIG. 14, inlet 136 sends wafer coolant through support base plate 46 and to the wafer coolant outlet 1 138. Gas inlet 140 permits introduction of chuck coolant gas (compressed air or helium) through vacuum plate 46 and into the coolant block of the multipurpose chuck. Gas outlet 142 receives heated coolant gas from the cooling block of multipurpose chuck (gas outlet 2) via vacuum feed through 155. Coolant outlet 138 receives coolant water from the vacuum base plate. Inert purge gas (helium) from multipurpose chuck 146 pass through support base plate 46 by passing through vacuum feed-through 158. Thermocouple connection tunnel 144 permits electrical connection to a thermocouple for sensing chuck 50 temperature via a feed through 156. Coolant inlet 148 provides a second path for coolant water flow within the vacuum base metal plate 46. Gas inlet 150 is one of the two coolant gas inlets for heat removal from multipurpose chuck. Coolant gas release from the cooling block of the multipurpose chuck, gas outlet 152 provides a flow path. Coolant outlet 154 permits coolant water to pass through vacuum plate 46. Vacuum feed-through 153 receives heated coolant gas from cooling block and directs the gas via grooves in vacuum plate 46 to gas outlet 152. The water-cooled vacuum base plate also acts as a heat sink or a heat exchanger for the coolant gas channels connected to the cooling block of the chuck. At the planar center of vacuum plate 46 appears inert purge feed-through 158. Thermocouple feed-through 156 also appears at the vacuum plate 46 planar center and penetrates vacuum plate 46 and connects to thermocouple connection 144 with proper wire insulation. The vacuum base plate 46 is made of a lower section with grooves and a thin flat upper section. The two thin plates are brazed and/or welded together in order to contain the grooves within the bulk of the base plate 46. The RF connection feed through can be placed at the center of the vacuum base plate 46 (not shown).

Multipurpose chuck 50 provides electrical contact between RF plate 104 and an RF power source (not shown) via RF feed-through 86, but at the same time passes the magnetic field distribution from magnetron module 20. Also, multipurpose chuck 50 provides for fairly rapid heating and cooling of semiconductor wafer 52. Therefore, the thickness and magnetic properties of RF chuck 50 can affect the magnetic field uniformity and field strength that the semiconductor wafer 52 sees within process chamber as well as the ultimate plasma density and process uniformity for the MPE process itself.

Multipurpose chuck 50 is designed as a low thermal mass chuck for maximum MPE processing throughput and uniformity. This occurs when the greatest amount of magnetic flux lines penetrate the chuck to affect plasma ion formation near the semiconductor wafer 52 face. Accordingly, the chuck of the present disclosure has a thickness of less than one-half that of most conventional plasma processing chuck. The total thickness of the chuck of this disclosure including the entire vacuum base plate can be as small as about 1"–1.25".

Another design consideration for multipurpose chuck 50 is that it be able to rapidly heat and cool semiconductor wafer 52. For transferring thermal energy to the semiconductor wafer 52 and achieving uniform wafer heating, therefore, the chuck 50 thermal mass should be large compared to that of semiconductor wafer 52. However, for rapid wafer heating and cooling, or short thermal transients, the thermal mass should not be excessively large. Additionally, for maximum energy transfer from heating element 102 and heat extraction from the cooling module 90, respectively, chuck 50 employs two high thermal conductivity electrically insulating disks (boron nitride) to separate the heater from cooling block and the cooling block from RF plate 104.

Fully understanding how multipurpose chuck 50 achieves these design objectives is best understood by appreciating its fabrication. In particular, the fabrication methods for heating element 102 and RF plate 104 demonstrate how chuck 50 achieves the above design objectives. Fabricating heater element 102 of chuck 40 calls for the use of thin film technology on a substrate made of boron nitride, SiC-coated graphite or quartz wafer. The starting material for heater element 102, therefore, is a 1/16" thick, 7"–8" diameter substrate (for 6" wafer processing). To fabricate heating element 102, first deposit multiple layers of silicon oxide (1μm $SiO_2$), then silicon nitride (1000 Å $Si_3N_4$), then silicon oxide (1 $\mu m iO_2$) on heater substrate by sputtering or CVD. This multilayer insulator acts as a buffer barrier and passivation layer (particularly on graphite or boron nitride). Then apply a layer of silicon (1000 Å Si) on these layers. Silicon layers act as an adhesion promoter. Sputter a 2.5 micron thick (or more) layer of tungsten (or other refractory metal) on the silicon layer, and then pattern the tungsten using either a lift-off or conventional patterning technique to produce power resistor 120. Deposit a thick layer of silicon oxide (1μ $SiO_2$), silicon nitride (1000 Å $Si_4$), and silicon oxide (1 μm $SiO_2$) on the substrate as passivation overlayer. Then, open contact holes in this layer for electrical connecting heater wires 90 and 94 via contacts 132. Electrical connections may be made via electron beam welding or spring leading of wire, on contact region. Heater wires 90 and 94 will pass vertically through the contact holes in the quartz support module 48 and vacuum plate 46. The pattern shown in FIG. 13 indicates a one-zone heater.

An example of how to determine the necessary physical dimensions of the tungsten wires for the heater assembly is helpful for fabricating chuck 50. The resistivity, of tungsten wire at room temperature is 5μΩ cm. Assume, for example, that the wire thickness, t, equals 2 μm. Then, for a maximum $T_{max}$=750° C., a wafer with an emissivity of 1.0 will emit about 7 watts/cm² from both surfaces. Furthermore, assume that the maximum blackbody radiation loss from one side approximately equals 4 W/cm². Therefore, design the heater block for a power rating of 5 W/cm². If we use a 7" circular RF plate u in the chuck, its area is 248 cm². Thus, its maximum power dissipating, $P_{max}$, will be 1241 watts (=248 cm²×5 W/cm²). Therefore, design the heater for a maximum power dissipation of at least 1250 watts. However, this is a lower limit of the maximum power required for steady-state heating at desired peak process temperature (e.g., 750° ). Rapid heat-up transients usually require transient heating power levels several times larger than the steady-state power level (e.g. 3–5x larger power).

With this level of power dissipation, the next step is to calculate the necessary tungsten heater wire length for power resistor 120. Assume that there are n wires distributed uniformly in parallel on a 7" graphite wafer. Further, assume that the peak rms voltage across the tungsten wire equals 115 V. Then, for a $P_{max}$ value of 1250 watts, the maximum current, $I_{max}$, equals 1250/115≈11 A. For this current flow, the proper resistance, R=V/$I_{max}$=115 V/11A≈10Ω.

To reduce power per unit length, maximize the resistor wire length. Let the wire length, L, equal approximately 240 cm, then the unit power dissipation will be approximately 5.2 Watts/cm (=$P_{max}$/L=1250 W/240 cm.). For an arbitrary tungsten wire width, W, there are 240/W squares in the entire wire. For a resistance, R, of approximately 10 Ω,R=$R_s$*240/W=p/t(cm)*240/W(cm), so the total area of a wire cross-section, W*t (cm²), equals 1.2×10⁻⁴cm²)), which results in a current density well below the electro-migration limit of tungsten wire. As a result, the tungsten wire is an excellent material as power resistor 120 for the purposes of chuck 50. These considerations may facilitate the fabrication of heater element 102. Other refractor metals (such as titanium or molybdenum), and refractory metal nitrides and silicides may also be used as heater material. The heater may be designed in a multizone configuration for the best heating uniformity results. Typically 3 or 4 heating zones are required in order to optimize the transient and steady-state heating uniformity. Multi-zone resistive heaters can employ rings of resistive heaters with some cylindrical symmetry.

In a similar fashion, the following discussion may assist in fabricating RF plate 104 for chuck 50. RF plate connects to an RF source via RF contact 86 for a maximum RF power coupling of several hundred watts. To fabricate the RF plate with this capability, a preferred starting material for this portion of the device is a 7" conductive wafer made of SiC-coated graphite or a metal such as molybdenum with a thickness of 1 mm. An anodized aluminum plate may be used for a chuck with a maximum heating temperature of 500° C.

Having described the preferred embodiment of magnetron module 20 of the present invention and multipurpose chuck 50, their use together will be described. It should be remembered, however, that the magnetron of the present invention will operate without the use of the multipurpose chuck and with a variety of other RF chucks. The low thermal mass multipurpose chuck, on the other hand, significantly enhances the overall performance and utilization of the magnetron module.

Semiconductor wafer 52 is placed face-down against the surface of the RF chuck during processing and magnetron module 12 is positioned outside the vacuum process equipment on the top of the stainless steel vacuum plate 46 which supports wafer chuck 50 and quartz support 48 assembly inside the process chamber 22. This arrangement will produce a magnetic field distribution with a strong transverse flux component parallel to the wafer 52 surface. Magnetron module 20 generates a uniform magnetic field distribution which encompasses the wafer 52 surface. In order to adjust the magnetic field and produce the desired changes to the magnetic field distribution and strength, pins 26 can be adjusted by inserting or pulling them from top plate 34. The degree of magnetic flux field adjustment can be determined by various methods. One possible method is to analyze the resulting semiconductor wafer 26 process uniformity following an MPE deposition or etching process. The field adjustment capacity is a powerful feature which allows process uniformity and rate optimization in various applications such as etch, deposition, and surface cleaning.

Although the particular configuration of this disclosure illustrates magnetron module 20 in use with a single-wafer reactor for face-down wafer processing, magnetron module 20 of the present invention is applicable to any format of wafer processing (face-up, face-down, or vertical). Moreover, the magnetron module of this invention can be used with or without the module rotation. The module rotation is done on a vertical rotation axis passing through the center of semiconductor wafer, corresponding to the central axis of the process chamber.

In the implementation of the present invention, the material layers (stainless steel vacuum plate, quartz, multipurpose RF chuck) that separate the wafer from magnetron module 20 are nonmagnetic and do not affect the magnetic field distribution on the wafer 52 surface. Excessive ion energies also degrade important etch process parameters such as etch selectivity. Poor etch selectivities caused by the physical etching action of energetic ions result in reduced over-etch time budget and very demanding etch uniformity requirements. If necessary, magnetron module 20 can be moved vertically away from the stainless steel vacuum base plate and the wafer in order to reduce the magnetic field strength on the wafer. In addition, the magnetic field strength can be adjusted by proper use of the adjustment pins.

The measured magnetic flux density distribution plats illustrated in FIGS. 15-23 were obtained on a preferred embodiment of the magnetron module for the present invention made of ceramic permanent magnet components. The adjustment pins were not used during these measurements. Although the measurements were obtained on a magnetron module employing ceramic magnetic components, the general shapes of the magnetic field distribution for magnetron modules made of higher energy rare-earth permanent magnets are similar to those shown here. Higher energy rare-earth magnetic components provide stronger magnetic flux densities compared to the lower energy ceramic magnets.

Although the invention has been described with reference to the above specific embodiments, this description is not meant to be construed in a limiting sense. Various modifications of the disclosed embodiment, as well as alternative embodiments of the invention will become apparent to persons skilled in the art upon reference to the above description. It is therefore contemplated that the appended claims will cover such modifications that fall within the true scope of the invention.

What is claimed is:

1. A magnetron plasma processing module with magnetic field adjustment for magnetron-plasma-enhanced processing of a semiconductor device, comprising:
   a magnetron housing;
   a plurality of magnets connected to said housing and associated for producing a magnetic field at the semiconductor device; and
   a plurality of pins adjustable mounted to said housing and associated for varying said magnetic field at the semiconductor device.

2. The module of claim 1, wherein said housing comprises:
   a top plate for adjustably engaging said magnetically conductive pins;
   a cylinder supporting said top plate and having openings for receiving said pins from said top plate; and
   a magnet assembly for establishing the magnetic field, said magnet assembly comprising an iron ring adjoining said cylinder for providing support to said assembly and surrounding a bore within said assembly wherein the plurality of magnets are connected to said iron ring and surround said bore for providing the magnetic field and said assembly further comprises a plurality of extension bars associated with said magnets and surrounding said bore for producing a substantially uniform magnetic field within said bore.

3. The module of claim 2, wherein said magnet assembly is operable for producing the uniform magnetic field at the semiconductor device.

4. The module of claim 2, wherein each of said pins comprises:
   a stop for limiting movement of said pin into said opening;
   a shaft connected to said stop, and having a length at least equaling the cylindrical height of said cylinder plus the height of the magnet assembly; and
   a tip connected to said shaft and associated to enter said bore for adjusting said magnetic field.

5. The module of claim 4, wherein said tip comprises a block for assisting adjustment of said magnetic field.

6. The module of claim 2, wherein said pins reciprocate between said cylinder and said magnet assembly to modify the magnetic field distribution at the semiconductor device.

7. The module of claim 2, wherein said pins reciprocate between said cylinder and said magnet assembly to modify the magnetic flux density at the semiconductor device.

8. The module of claim 2, wherein said magnets mount within said magnet assembly to form at least two groups of magnets said groups having opposite polarities with respect to each other for closing magnetic field flux lines between said groups.

9. The module of claim 1, wherein said magnets produce a uniform transverse magnetic field.

10. The module of claim 1, wherein said magnets comprise a permanent magnetic material.

11. The module of claim 1, wherein said magnets comprise electromagnets.

12. The module of claim 1, wherein said magnets comprise ceramic magnets.

13. The module of claim 1, wherein said magnets comprise alnico magnets.

14. The module of claim 1, wherein said magnets comprise rare-earth magnets.

15. The module of claim 1, further comprising a rotation mechanism for rotating said magnetron module.

16. A system for plasma-assisted processing of a semiconductor device using a magnetron-plasma-enhanced process, said system comprising:
    a magnetron with magnetic field adjustment for magnetron-plasma-enhanced processing of the semiconductor device, comprising:
        a magnetron housing;
        a plurality of magnets connected to said housing and associated for producing a magnetic field at the semiconductor device; and
        a plurality of magnetically conductive pins adjustably mounted to said housing and associated for varying said magnetic field at the semiconductor device; and
    a radio frequency chuck, comprising:
        a coolant module for extracting heat from the semiconductor device:
        a heating apparatus adjoining said coolant module for heating the semiconductor device; and
        a radio frequency plate for associating an electromagnetic radio frequency power source with the semiconductor device.

17. The system of claim 16, wherein said housing comprises:
    a top plate for adjustably engaging said magnetically conductive pins;
    a cylinder supporting said top plate and having openings for receiving said pins from said top plate; and
    a magnet assembly for establishing the magnetic field, said magnet assembly comprising an iron ring adjoining said cylinder for providing support to said assembly and surrounding a bore within said assembly, wherein the plurality of magnets are connected to said iron ring and surround said bore for providing the magnetic field and said assembly further comprises a plurality of extension bars associated with said magnets and surrounding said bore for producing a substantially uniform magnetic field within said bore.

18. The system of claim 17, wherein said magnet assembly is operable for producing the uniform magnetic field at the semiconductor device.

19. The system of claim 17, wherein said iron ring separates said cylinder from said magnet assembly and engages said extension bars and magnets for closing the magnetic field lines on one end of the magnet poles.

20. The system of claim 17, wherein each of said pins comprises:
    a stop for liming movement of said pin into said opening;
    a shaft integral to said stop, and having a length at least equaling the cylindrical height of said cylinder plus the height of said magnet assembly; and
    a tip integral to said shaft and associated to enter said bore for adjusting said magnetic field.

21. The system of claim 20, wherein said tip further comprises an iron block termination for assisting adjustment of said magnetic field.

22. The system of claim 17, wherein said pins reciprocate between said cylinder and said magnet assembly to modify the magnetic flux distribution at the semiconductor device.

23. The system of claim 17 wherein said pins reciprocate between said cylinder and said magnet assembly to modify the magnetic flux strength at the semiconductor device.

24. The system of claim 17, wherein said radio frequency chuck comprises the property of being nonmagnetic.

25. The system of claim 17, wherein said coolant module further comprises a top plate and a bottom plate, said bottom plate coupled to said top plate of the coolant module and formed to permit a coolant to pass therebetween.

26. The system of claim 17, wherein said heating apparatus further comprises:
    a top layer of electrical insulation;
    a power resistor set within said top layer for generating heat energy to heat the semiconductor device;
    a bottom layer of electrical insulation adjoining said top layer and sealing therebetween said power resistor; and
    a wafer adjoining said bottom layer and structurally supporting said heating apparatus.

27. A system for magnetron-plasma-enhanced processing of a semiconductor device, comprising:
    a semiconductor device processing reactor;
    a radio frequency chuck, said chuck comprising:
        a coolant module for extracting heat from the semiconductor device;
        a heating element adjoining said coolant module for heating said semiconductor device; and
        a radio frequency plate for associating an electromagnetic radio frequency power source with the semiconductor device; and
    a magnetron, said magnetron comprising:
        a magnetron housing;
        a plurality of magnets connected to said housing and associated for producing a magnetic field at the semiconductor device; and
        a plurality of pins adjustably mounted to said housing and associated for varying said magnetic field at the semiconductor device.

* * * * *